US006911779B2

(12) United States Patent (10) Patent No.: US 6,911,779 B2
Madocks (45) Date of Patent: Jun. 28, 2005

(54) MAGNETIC MIRROR PLASMA SOURCE

(76) Inventor: John Madocks, 110 E. Yvon Dr., Tucson, AZ (US) 85704

( * ) Notice: Subject to any disclaimer, the term of this patent is extended or adjusted under 35 U.S.C. 154(b) by 6 days.

(21) Appl. No.: 10/475,546

(22) PCT Filed: Apr. 10, 2002

(86) PCT No.: PCT/US02/11542

§ 371 (c)(1),
(2), (4) Date: Oct. 20, 2003

(87) PCT Pub. No.: WO02/086932

PCT Pub. Date: Oct. 31, 2002

(65) Prior Publication Data

US 2004/0155592 A1 Aug. 12, 2004

Related U.S. Application Data

(60) Provisional application No. 60/285,360, filed on Apr. 20, 2001, provisional application No. 60/285,361, filed on Apr. 20, 2001, and provisional application No. 60/285,364, filed on Apr. 20, 2001.

(51) Int. Cl.[7] .................................................. H01J 7/24
(52) U.S. Cl. ............................. 315/111.21; 315/111.71; 204/192.12; 204/192.1; 118/723 R; 118/723 FI
(58) Field of Search ...................... 315/111.21, 111.71, 315/111.41; 204/192.12, 192.1, 192.3, 192.32; 118/723 R, 723 FI, 723 VE

(56) References Cited

U.S. PATENT DOCUMENTS

| 2,146,025 A | 2/1939 | Penning |
| 3,282,815 A | 11/1966 | Kay et al. |
| 4,356,073 A | 10/1982 | McKelvey |
| 4,407,894 A | 10/1983 | Kadokura et al. |
| 4,445,997 A | 5/1984 | McKelvey |
| 4,624,767 A | 11/1986 | Obinata |
| 4,631,106 A | 12/1986 | Nakazato et al. |
| 4,761,219 A | 8/1988 | Sasaki et al. |
| 4,767,516 A | 8/1988 | Nakatsuka et al. |
| 4,784,739 A | 11/1988 | Kadokura et al. |
| 4,842,683 A | 6/1989 | Cheng et al. |
| 4,853,102 A | 8/1989 | Tateishi et al. |
| 4,863,756 A | 9/1989 | Hartig et al. |
| 4,874,497 A | 10/1989 | Matsuoka et al. |

(Continued)

OTHER PUBLICATIONS

Roth, "Industrial Plasma Engineering, vol. 1: Principles, reference section 3.4.2", IOP Publishing, Ltd. 1995, pp. 75–79.

Musil, et al., "Unbalanced magnetrons and new sputtering systems with enhanced plasma ionization", American Vacuum Society, Journal of Vacuum Science and Technology A 9 (3), May/Jun. 1991, pp. 1171–1177.

Decker, et al., "Surface Functionalization of Polymer Films and Webs Using Subatmospheric Plasmas", Society of Vacuum Coaters 41st Annual Technical Conference Proceedings, 1998, pp. 355–357.

Belkind, et al., "Magnetic biasing effects while using an unbalanced planar magnetron", American Vacuum Society, Journal of Vacuum Science and Technology A 11 (3), May/Jun. 1993, pp. 642–646.

*Primary Examiner*—Tuyet Thi Vo
(74) *Attorney, Agent, or Firm*—Dale F. Regelman

(57) ABSTRACT

The preferred embodiments described herein provide a magnetic mirror plasma source. While the traditional magnetic/electrostatic confinement method is ideal for many applications, some processes are not best served with this arrangement. The preferred embodiments described herein present a new technique to confine electrons (3) to produce a low pressure, dense plasma directly on a substrate surface (75). With these preferred embodiments, a combination of electrostatic and mirror magnetic confinement is implemented. The result is a novel plasma source that has unique and important advantages enabling advancements in PECVD, etching, and plasma treatment processes.

28 Claims, 15 Drawing Sheets

U.S. PATENT DOCUMENTS

| | | |
|---|---|---|
| 4,963,524 A | 10/1990 | Yamazaki |
| 5,000,834 A | 3/1991 | Yoshikawa |
| 5,099,790 A | 3/1992 | Kawakami |
| 5,135,819 A | 8/1992 | Ito et al. |
| 5,224,441 A | 7/1993 | Felts et al. |
| 5,225,024 A | 7/1993 | Hanley et al. |
| 5,328,583 A | 7/1994 | Kameyama et al. |
| 5,364,665 A | 11/1994 | Felts et al. |
| 5,437,725 A | 8/1995 | Schuster et al. |
| 5,439,574 A | 8/1995 | Kobayashi et al. |
| 5,527,394 A | 6/1996 | Heinrich et al. |
| 5,627,435 A | 5/1997 | Jansen et al. |
| 5,874,807 A | 2/1999 | Neger et al. |
| 5,900,284 A | 5/1999 | Hu |
| 5,945,008 A | 8/1999 | Kisakibaru et al. |
| 6,066,826 A | 5/2000 | Yializis |
| 6,077,403 A | 6/2000 | Kobayashi et al. |
| 6,103,074 A * | 8/2000 | Khominich ............ 204/192.38 |
| 6,190,496 B1 | 2/2001 | DeOrnellas et al. |
| 6,287,687 B1 | 9/2001 | Yializis et al. |
| 6,819,053 B2 * | 11/2004 | Johnson ................. 315/111.51 |

* cited by examiner

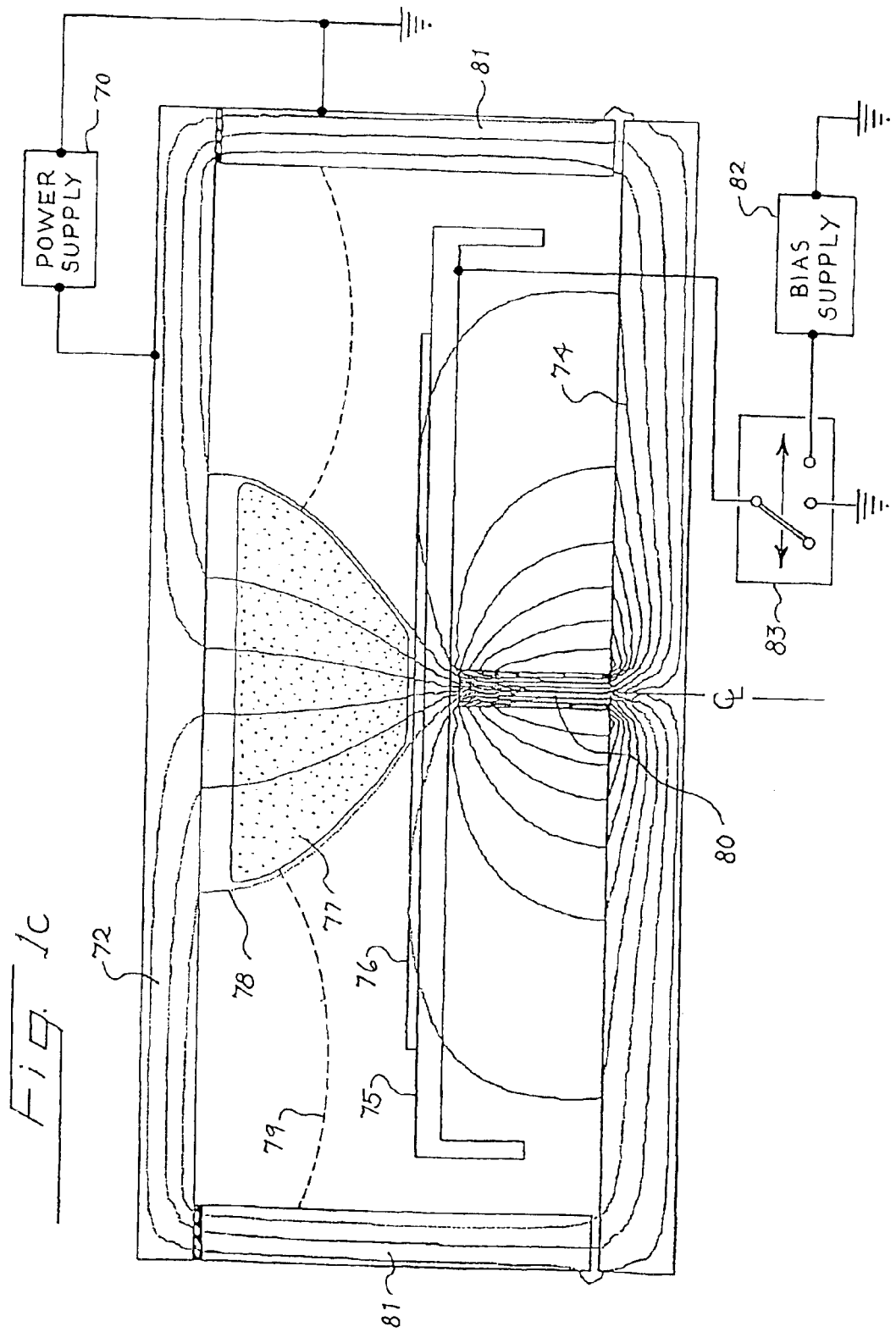

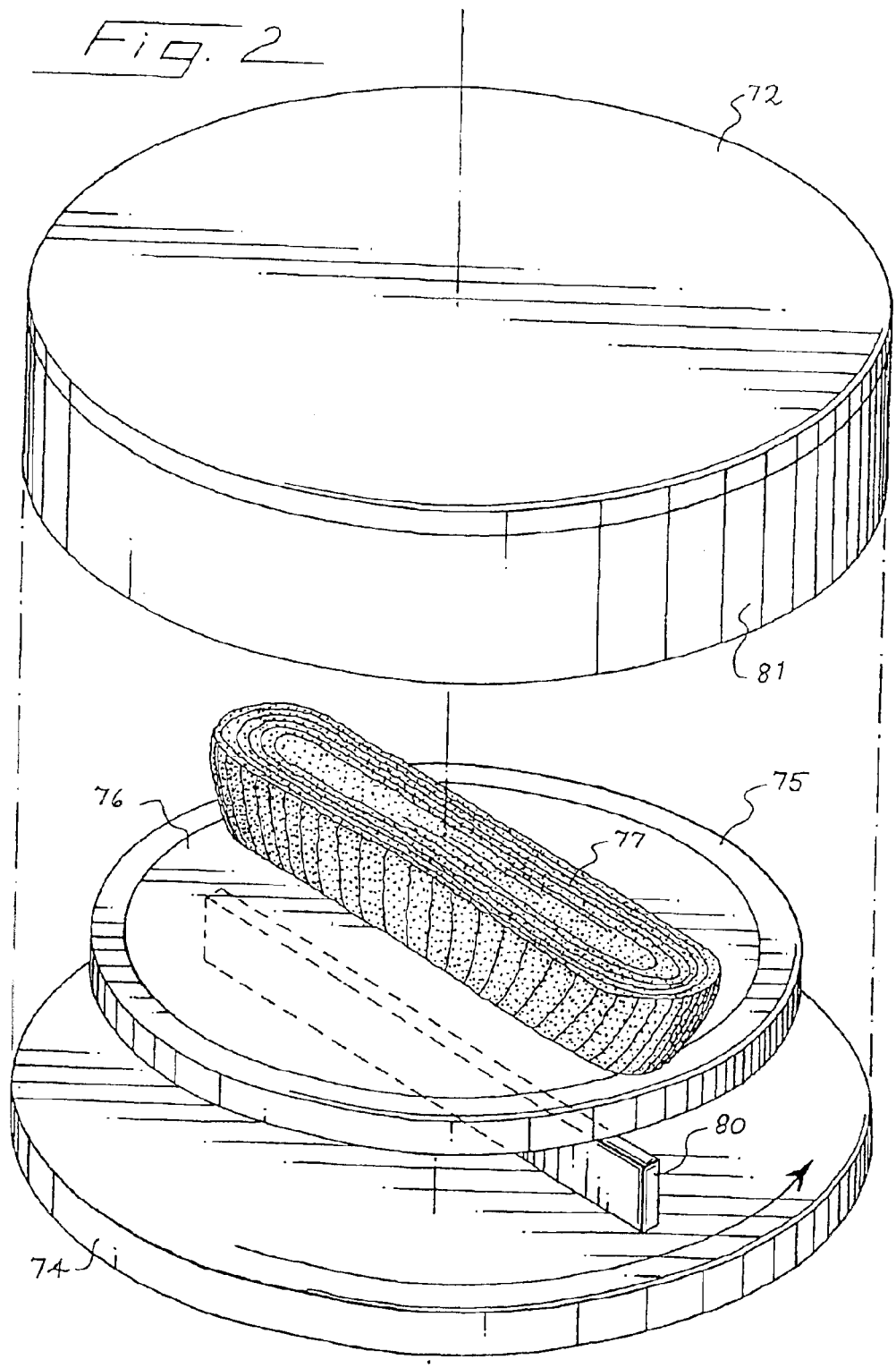

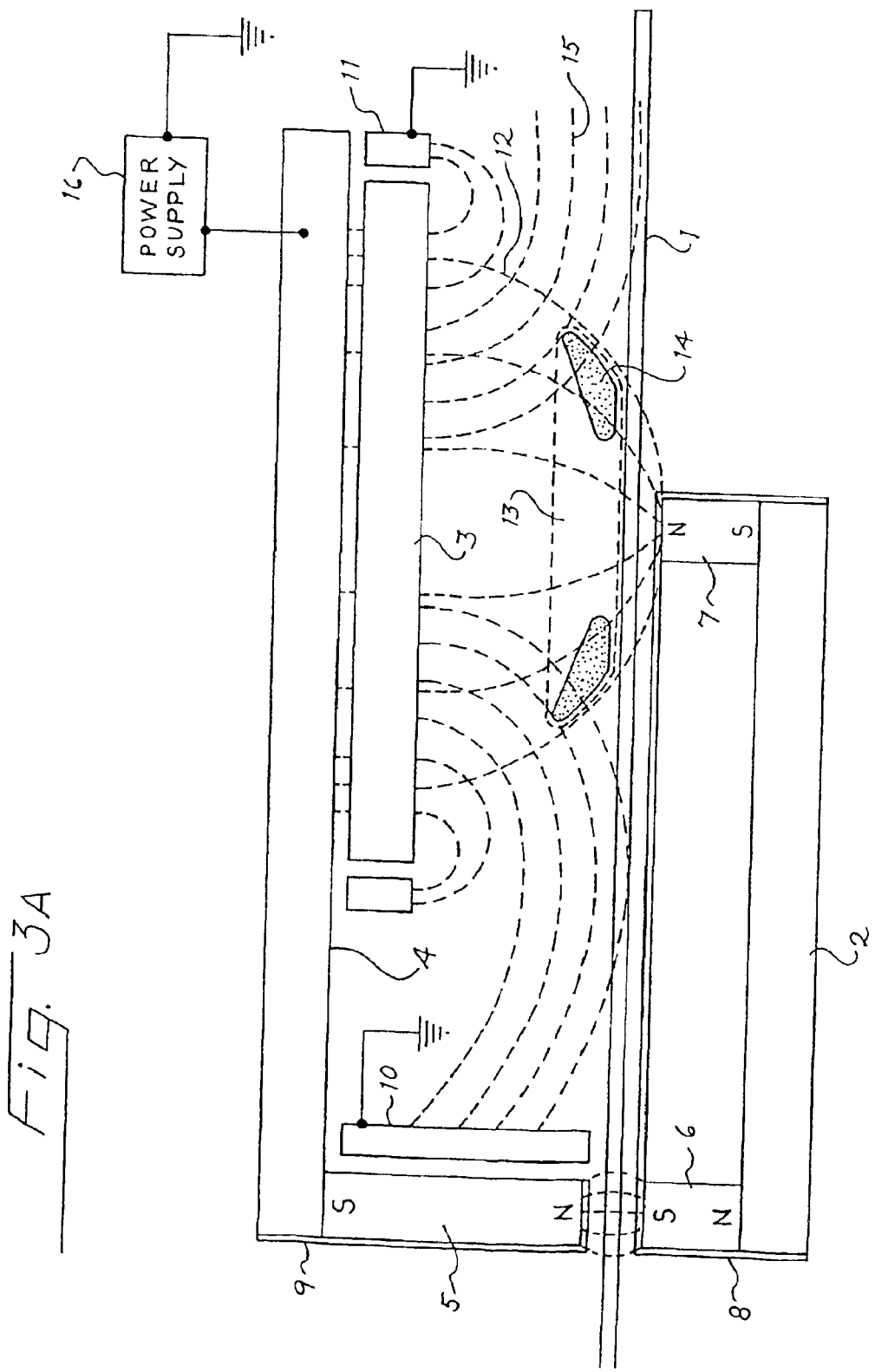

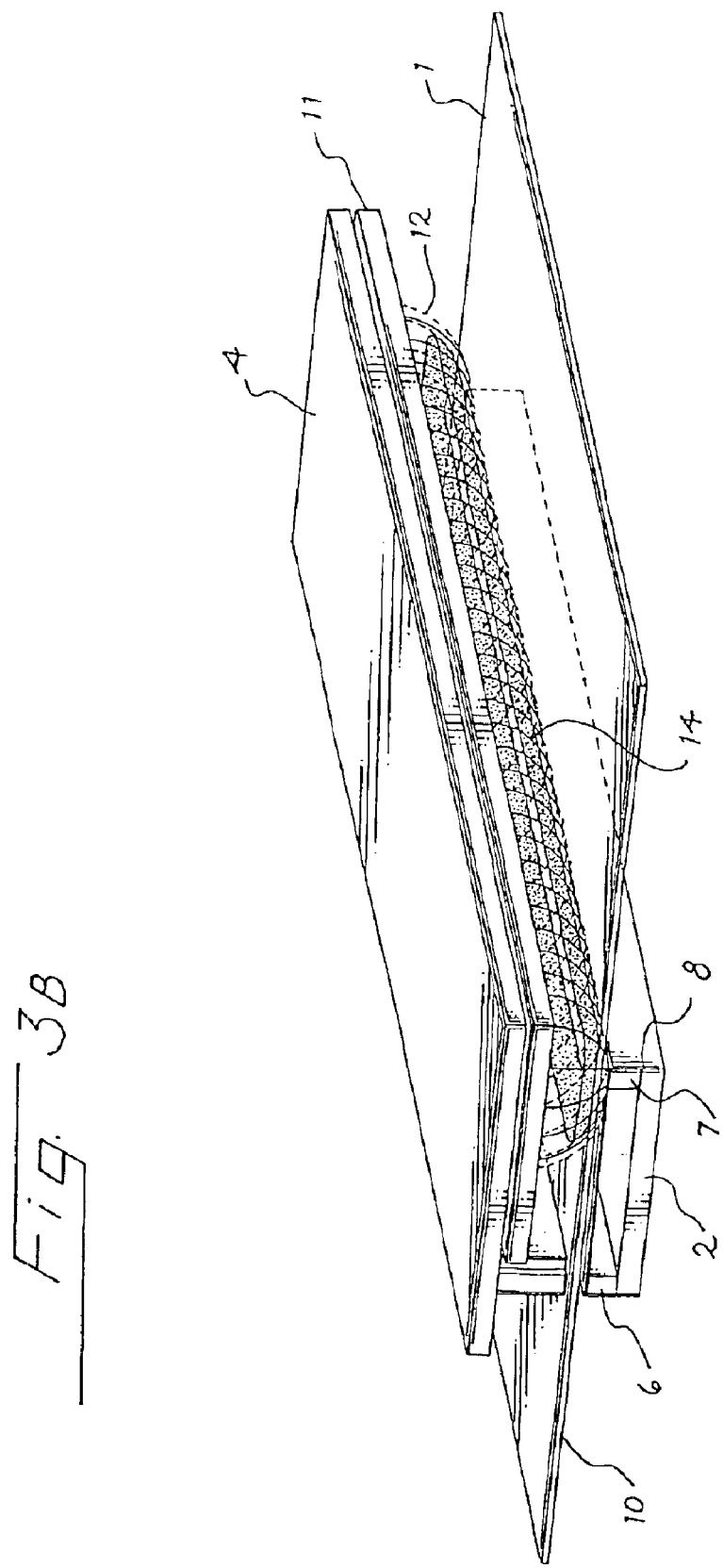

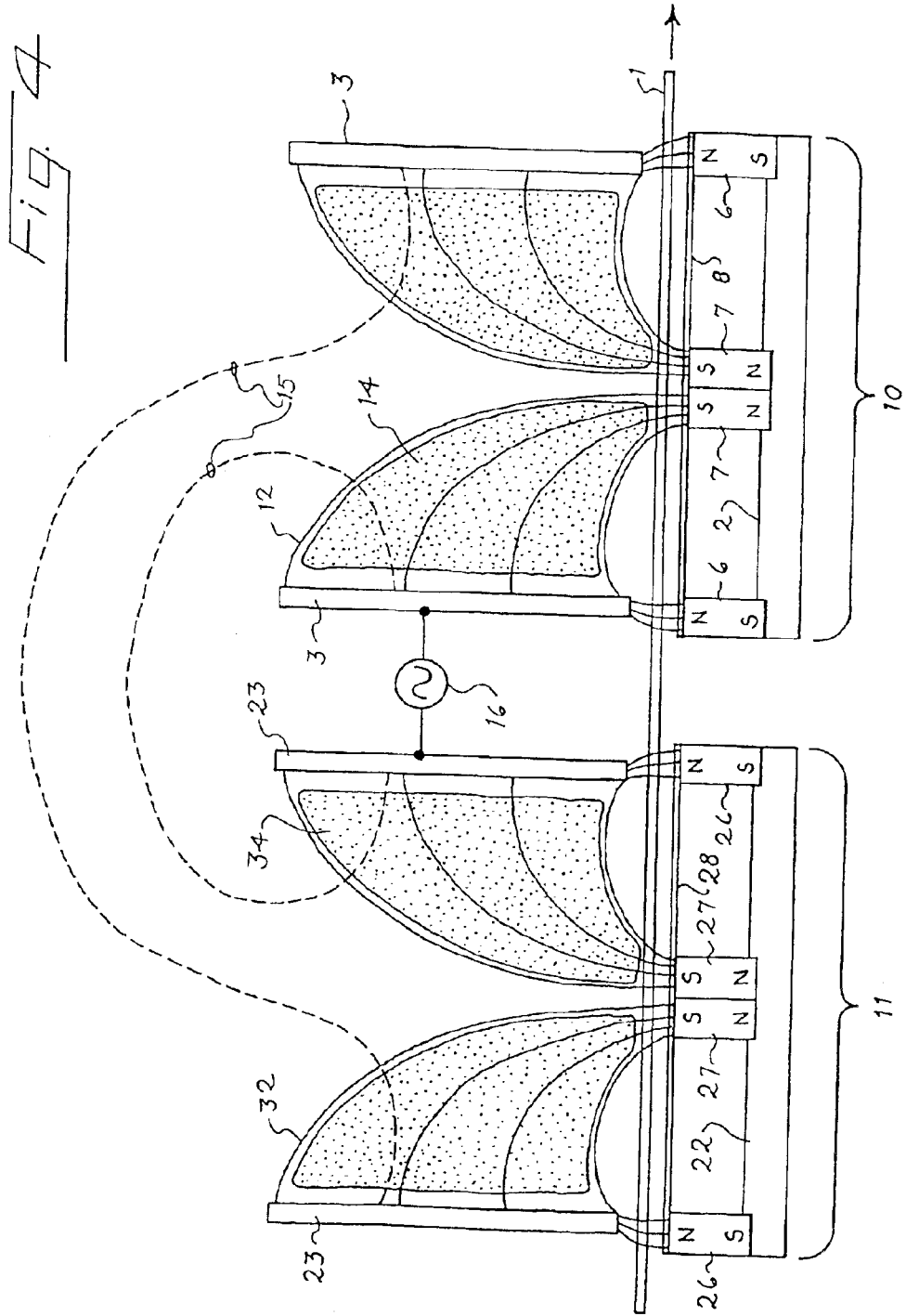

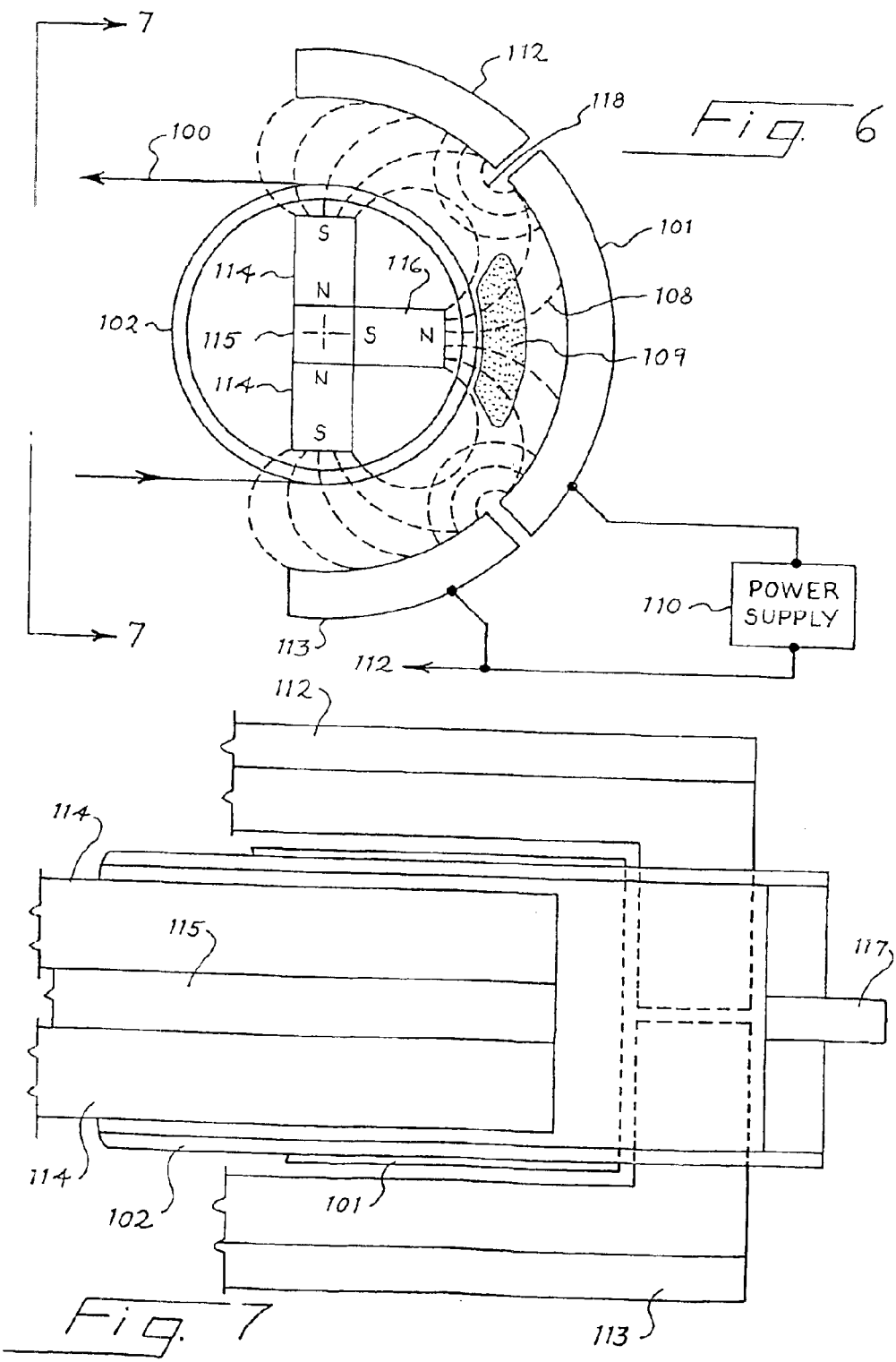

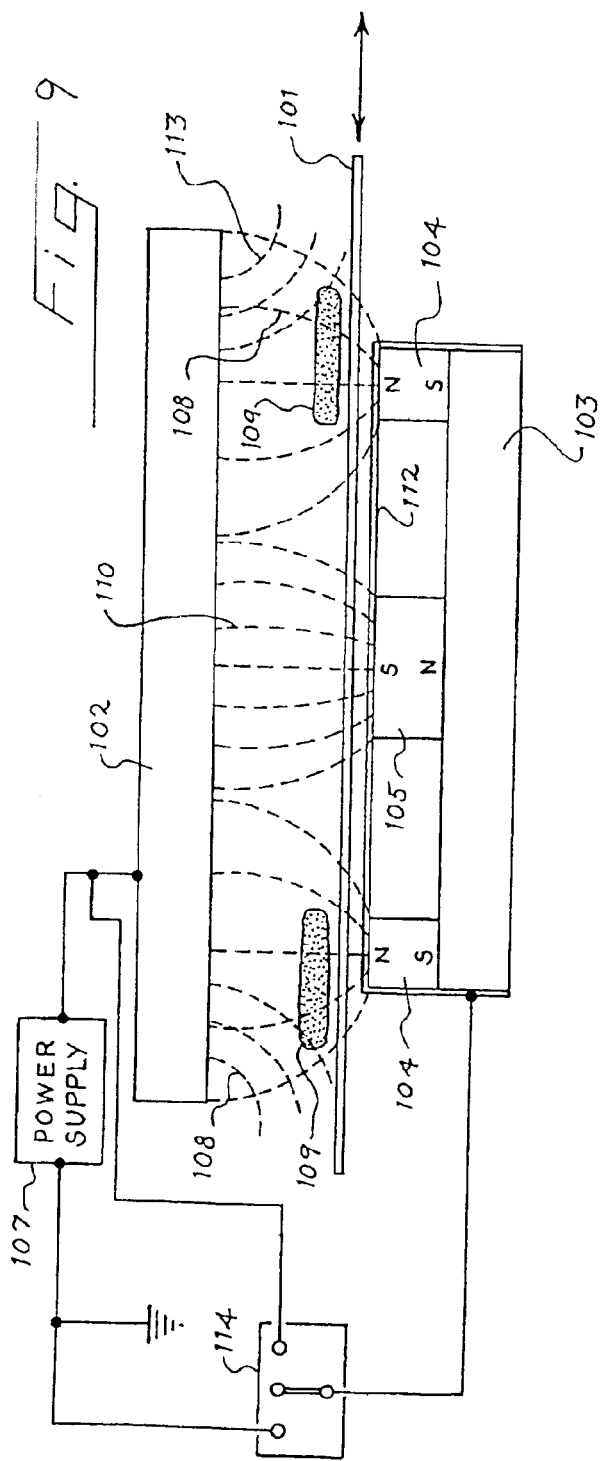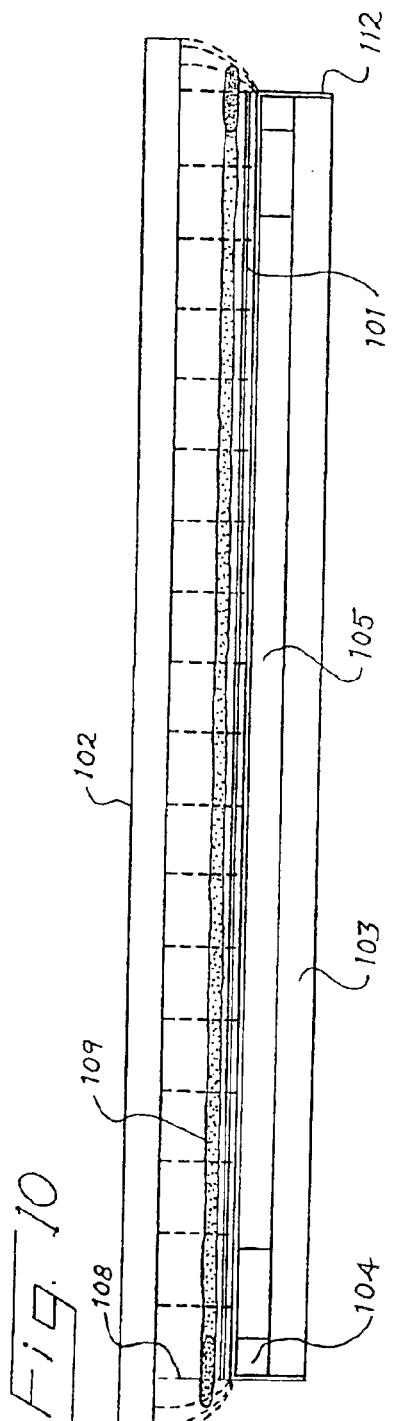

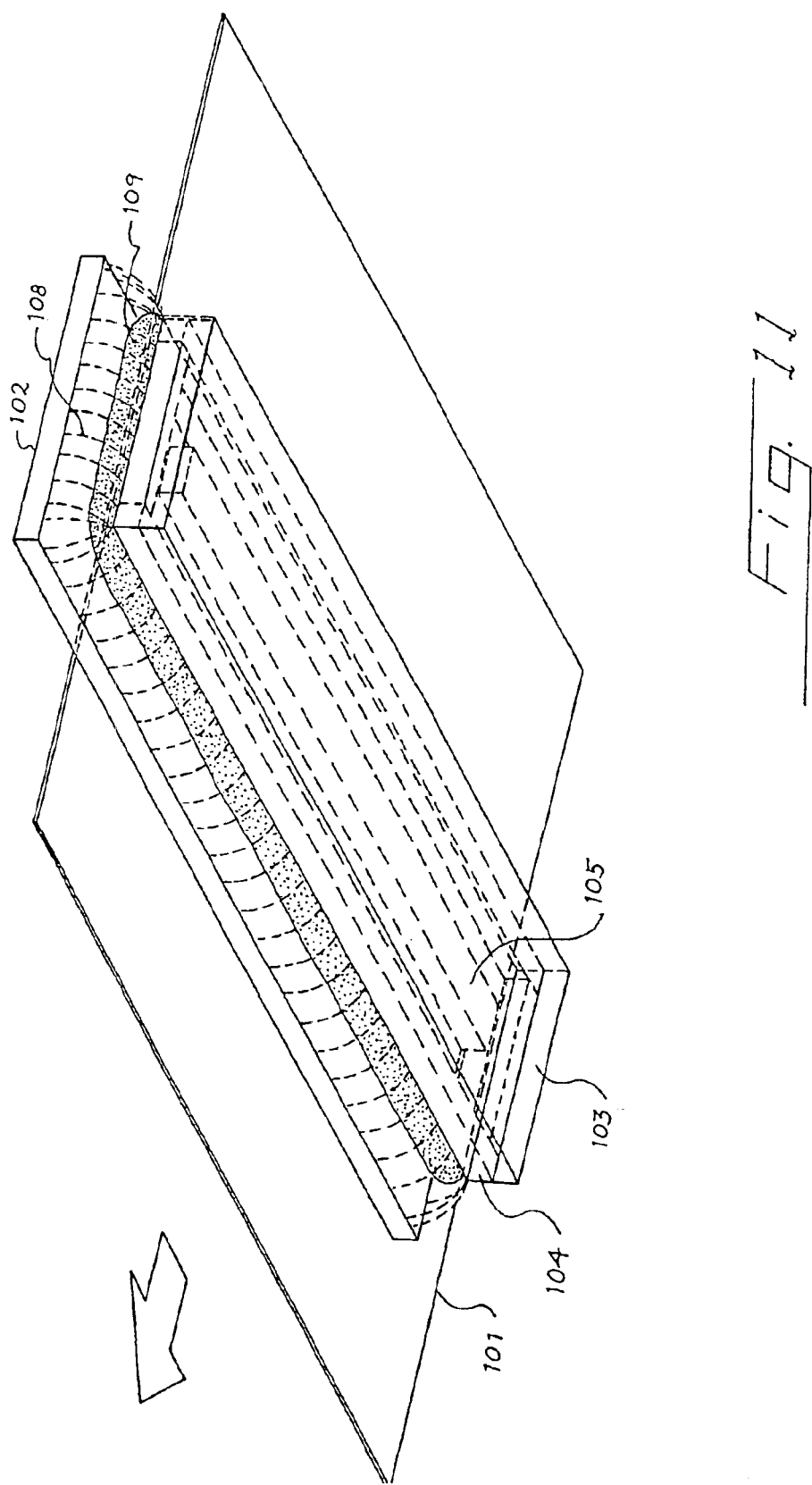

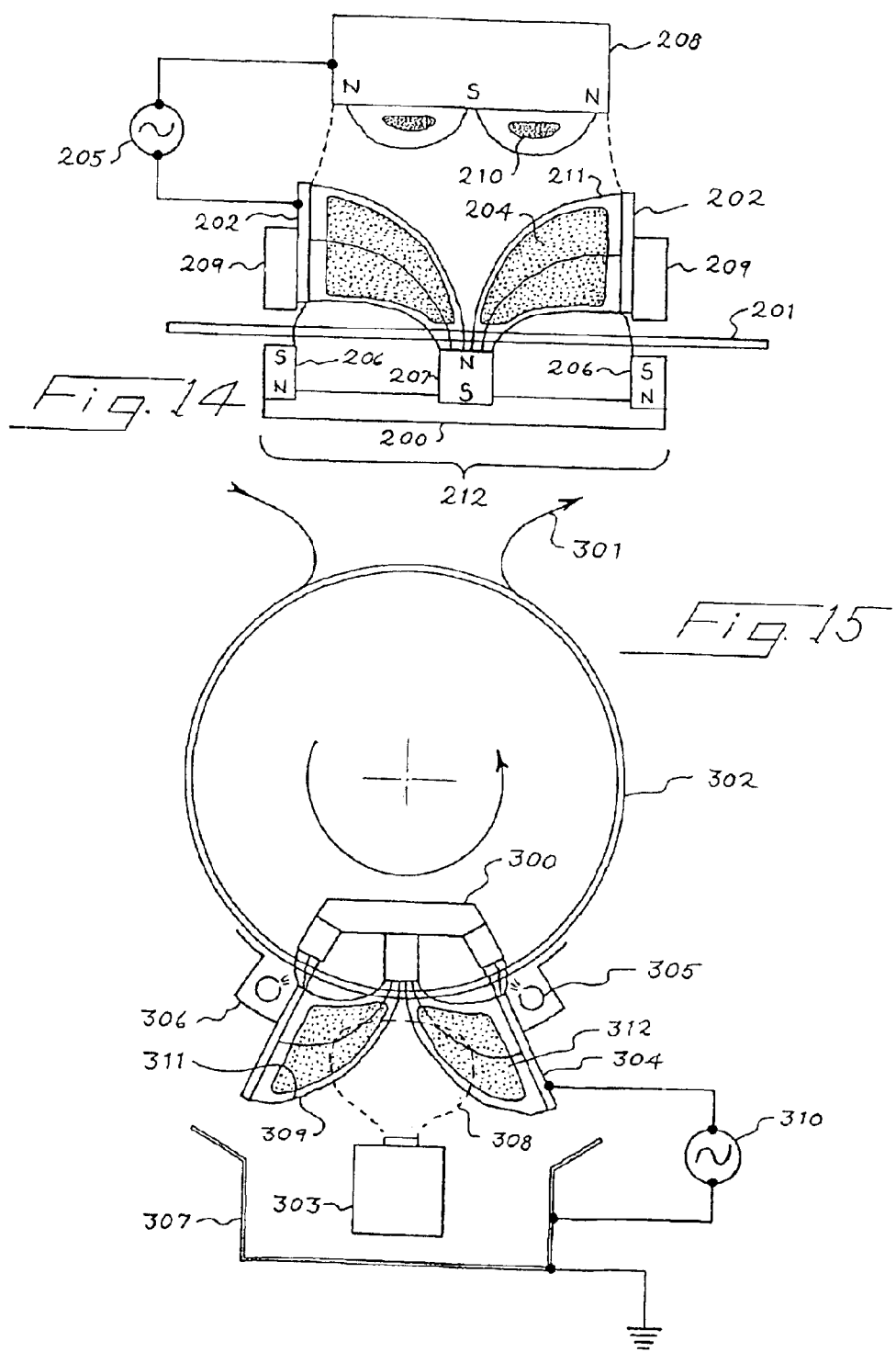

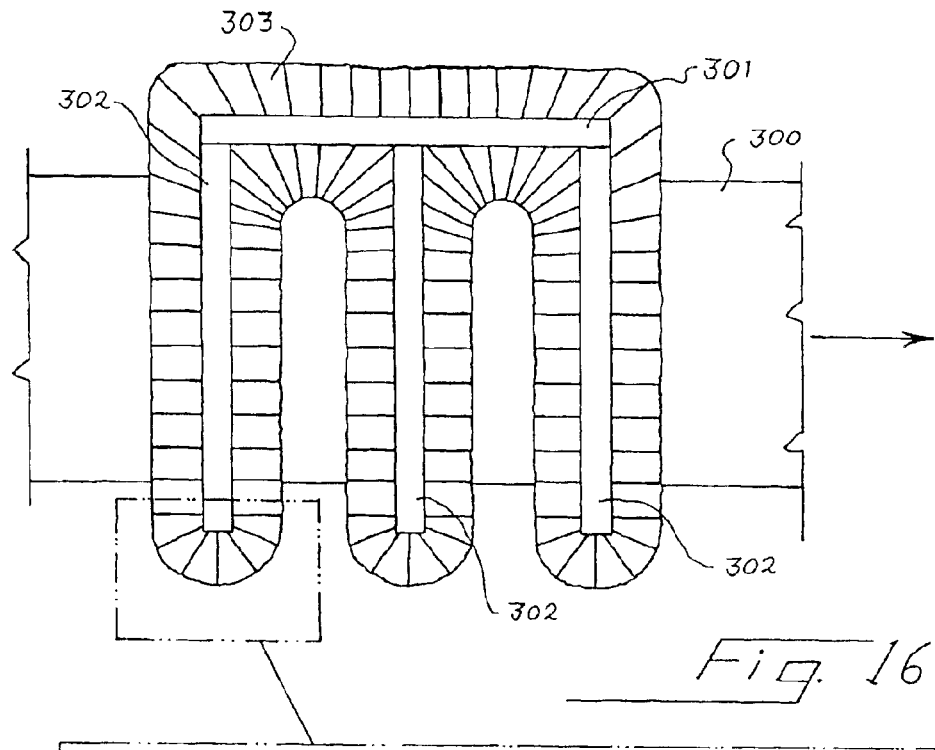
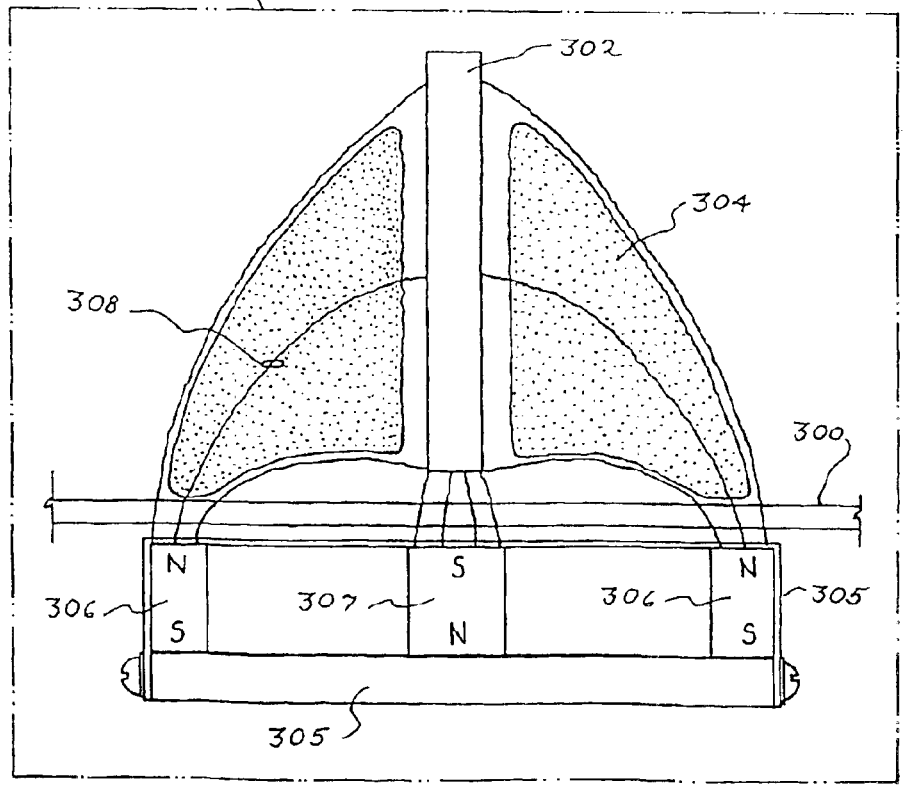
Fig. 16

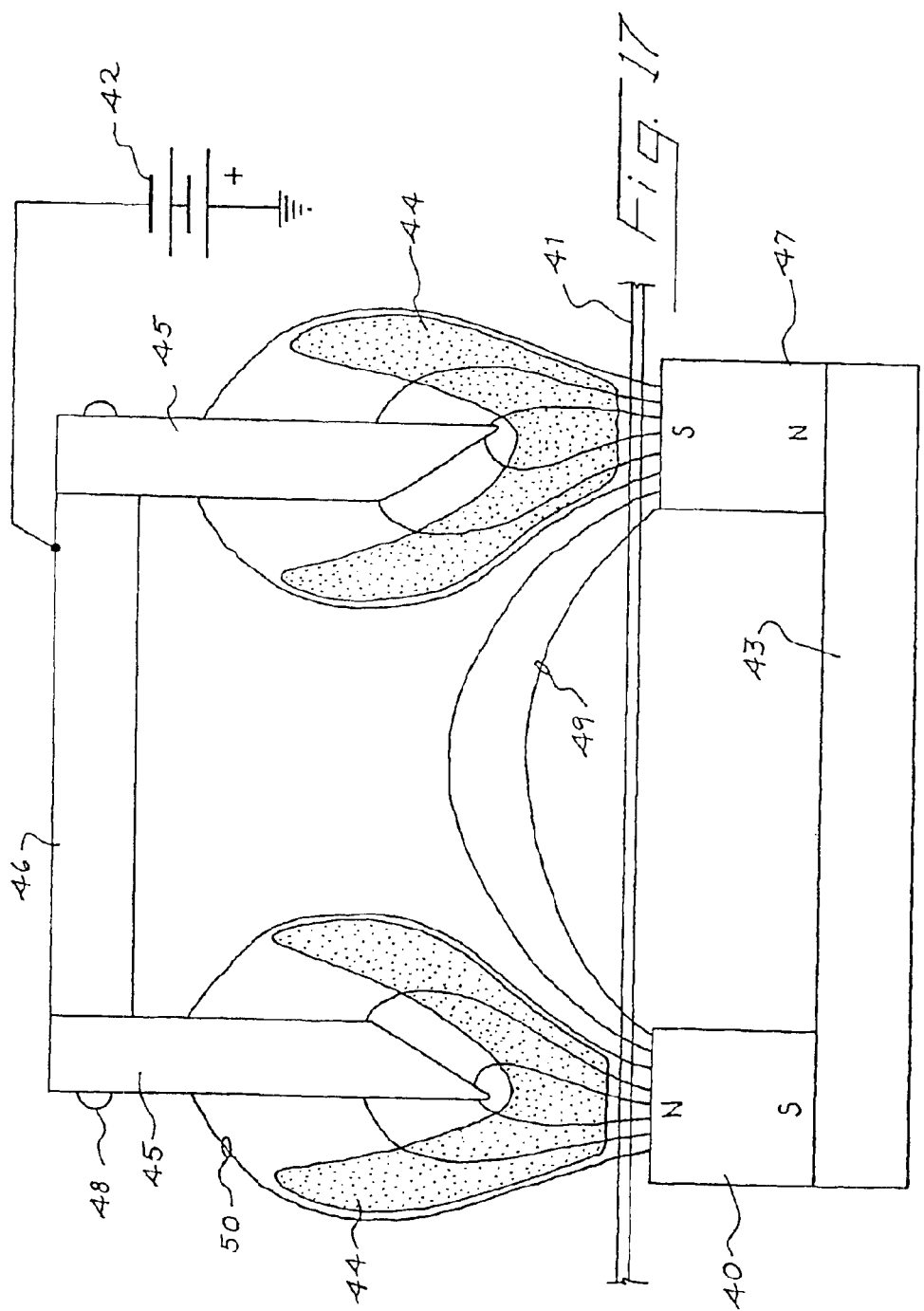

MAGNETIC MIRROR PLASMA SOURCE

CROSS REFERENCE TO RELATED APPLICATIONS

The present patent application claims the benefit of the filing date of U.S. provisional patent applications Ser. Nos. 60/285,360; 60/285,361; and 60/285,364, each of which was filed on Apr. 20, 2001 and each of which is hereby incorporated by reference.

This application also incorporates by reference PCT international Application No. PCT/US02/11542 which designated the United State of America and being filed on the same date as the present application.

BACKGROUND

The present invention relates to a magnetic mirror plasma source. Before turning to the detailed description of the presently preferred embodiments, related prior art is discussed below. The related prior art is grouped into the following sections: magnetic confinement and the Penning cell source, facing target sputtering, plasma treatment with a web on a drum, and other prior art methods and apparatuses.

Magnetic Confinement and the Penning Cell Source

A good presentation on magnetic mirror confinement is presented in section 3.4.2 of J. Reece Roth, *Industrial Plasma Engineering, Volume 1: Principles*, IOP Publishing, Ltd. 1995. Confinement of electrons and ions using magnetic mirrors is well known, especially in fusion research.

Facing Target Sputtering

U.S. Pat. No. 4,963,524 to Yamazaki shows a method of producing superconducting material. An opposed target arrangement is used with the substrate positioned between the electrodes in the magnetic field. The magnetic field is symmetrical between the electrodes, and the substrate is in the middle of the gap. With the substrate in this position, the Hall current generated within the magnetic field tends to be distorted and broken. When this happens, the plasma is extinguished and/or the voltage is much higher.

Plasma Treatment with a Web on a Drum

In U.S. Pat. Nos. 5,224,441 and 5,364,665 to Felts et al., a flexible substrate is disposed around an electrified drum with magnetic field means opposite the drum behind grounded shielding. In this arrangement, the shield opposite the drum is either grounded or floating. The substrate is supported by the surface without a mirror magnetic field emanating from the substrate.

In U.S. Pat. No. 4,863,756 to Hartig et al., the substrate is continuously moved over a sputter magnetron surface with the surface facing the magnetron located inside the dark space region of the cathode. In this way, the magnetic field of the magnetron passes through the substrate and is closed over the substrate surface constricting the plasma onto the surface.

Other Prior Art Methods and Apparatuses

U.S. Pat. No. 5,627,435 to Jansen et al. discloses a hollow cathode source operating at high, diode plasma regime pressures (0.1–5 Torr). The plasma is created inside the housing and then is emitted through holes. The plasma is generated in one chamber and then conducted to the substrate with the help of magnets under the substrate.

U.S. Pat. Nos. 6,066,826 and 6,287,687 to Yializis and Yializis et al. disclose a plasma treatment device for web materials. Similar to Jansen et al., a plasma is generated with a hollow cathode array and is 'focused' on the web by a magnetic field. As stated in the patent, the web charges up and the treatment stops when DC is used. As will be made clear below, this is different than the presently preferred embodiments. In the presently preferred embodiments, DC can readily be used with an insulating substrate without charge buildup over time. In these referenced patents, the magnetic field lines are not shown.

U.S. Pat. No. 6,077,403 to Kobayashi et al. shows a magnetron in combination with a second magnetic field. In this patent, the second field passes through the substrate to a supplemental electrode. This apparatus is not a stand-alone plasma source—it assists with ionizing and directing sputtered material to the substrate. Also, the first embodiment has the mirror field with a stronger magnetic field at the supplemental electrode than at the surface of the substrate.

In U.S. Pat. No. 4,631,106 to Nakazato et al., magnets are located under a wafer to create a magnetron type field parallel to the wafer. The magnets are moved to even out the process. The opposed plate is grounded, and the wafer platen is electrified.

U.S. Pat. No. 4,761,219 to Sasaki et al. shows a magnetic field passing through a gap with the wafer on one electrode surface. In this case, the electrodes are opposed to each other. The wafer is placed on the less compressed magnetic mirror surface, and the opposed surface across from the wafer is grounded.

U.S. Pat. No. 4,853,102 to Tateishi et al. uses a cusp field to assist sputter deposition into high aspect ratio holes. The flux lines leaving the substrate do not enter a negatively biased electrode.

U.S. Pat. No. 5,099,790 to Kawakami shows a microwave source with a moving magnet below the wafer to even out the coating on the wafer. In another figure, the substrates are moved over a stationary magnet(s). In this source, the plasma is generated in a separate plasma generation chamber and then directed to the wafer substrate with the assistance of the magnet under the substrate.

In U.S. Pat. No. 5,225,024 to Hanley et al., ExB containment is achieved by forcing the B flux into a parallel path over the substrate surface. U.S. Pat. No. 5,437,725 to Schuster et al. discloses a metal web drawn over a drum containing magnets. The web is electrified, and the opposed shield is at ground potential.

The source disclosed in U.S. Pat. No. 5,900,284 to Hu produces several magnetron type confinement traps on the surface above the magnets.

SUMMARY

The present invention is defined by the following claims, and nothing in this section should be taken as a limitation on those claims.

By way of introduction, the preferred embodiments described below relate to a magnetic mirror plasma source. In one preferred embodiment, a plasma source apparatus is provided comprising first and second surfaces with a gap between the surfaces, wherein the first surface comprises a substrate and wherein at least the second surface is connected to a power supply so as to contain electrons; a third surface connected to the power supply; a magnetic field passing through both the first and second surfaces and through the gap between the surfaces, wherein at least a portion of the magnetic field passing through the substrate is at least two times stronger at the substrate surface than at a weakest point along a field line within the gap and is strong enough to magnetize electrons; and an electric field created by the power supply connected between the second surface and the third surface, wherein the electric field penetrates into an electron confining region of the magnetic field so that a created Hall electron current is contained within an endless loop.

Other preferred embodiments are provided, and each of the preferred embodiments can be used alone or in combination with one another. The preferred embodiments will now be described with reference to the attached drawings.

BRIEF DESCRIPTION OF THE DRAWINGS

FIG. 1C shows a section view of a wafer plasma treatment apparatus of a preferred embodiment.

FIG. 2 shows an isometric view of the apparatus of FIG. 1C.

FIG. 3A shows a section view of a planar substrate plasma treatment apparatus.

FIG. 3B shows an isometric view of the apparatus of FIG. 3A.

FIG. 4 shows a section view of a dual source of a preferred embodiment.

FIG. 6 shows a section view of another apparatus for treating flexible web substrates.

FIG. 7 shows view A—A from FIG. 6 of the apparatus for flexible substrates.

FIG. 9 shows a section view of an apparatus for treating planar substrates.

FIG. 10 shows a side view of the source of FIG. 9.

FIG. 11 shows an isometric view of the source of FIG. 9.

FIG. 14 shows a section view of a source combined with a sputter magnetron.

FIG. 15 shows a section view of a source used to assist reactive deposition in an activated reactive evaporation source.

FIG. 16 shows a top view and section view of a source to treat planar substrates.

FIG. 17 is a section view of another planar substrate or flexible web plasma source.

DETAILED DESCRIPTION OF THE PRESENTLY PREFERRED EMBODIMENTS

In the prior art, many magnetically confined plasmas are confined in two dimensions by the magnetic field and electrostatically in the third dimension. A planar magnetron, for instance, confines the electrons in the racetrack with arcing magnetic field lines and the electrostatic potential of the cathode target.

While the traditional magnetic confinement method is ideal for many applications, some processes are not best served with this arrangement. The preferred embodiments described herein present a new technique to confine electrons to produce a low pressure, dense, relatively low voltage plasma. With these preferred embodiments, a combination of electrostatic and mirror magnetic confinement is implemented. The result is a novel plasma source that has unique and important advantages enabling advancements in PECVD, etching, and plasma treatment processes.

Figure 1A:
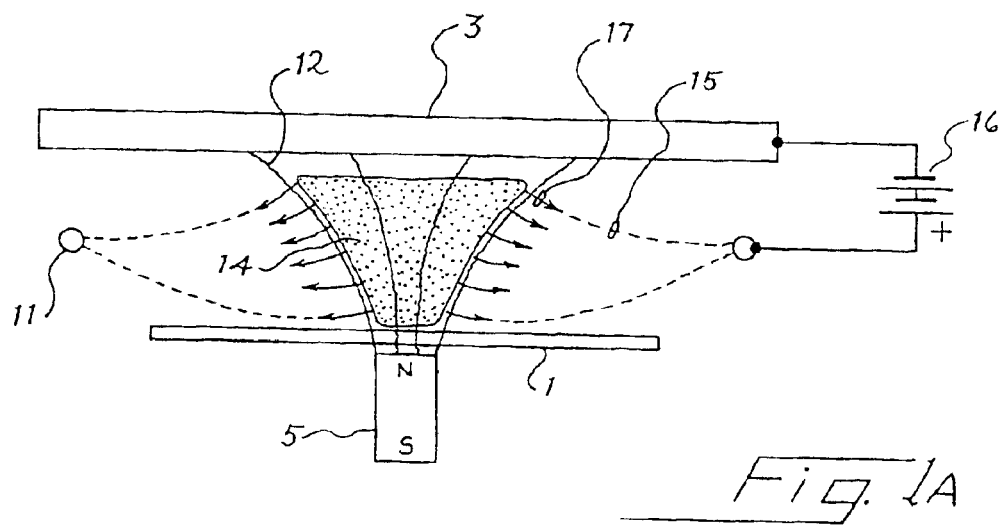
FIG. 1A shows a section view of a simple source of a preferred embodiment.

FIG. 1A shows a simple implementation of one preferred embodiment. A non-magnetic substrate 1 is placed over a magnet 5. A high permeability material such as steel serves as the cathode 3 and is positioned over substrate 1 at sufficient distance to allow a plasma to form between the cathode 3 and substrate 1. Anode 11 is a ring of wire positioned around the periphery of cathode 3. In this configuration, magnetic field lines 12 are formed between the magnet 5 and cathode 3. The field strength of these lines is stronger at the surface of the substrate 1 than at the cathode 3 forming a mirror magnetic field with the compressed end on the substrate 1. When a plasma voltage is impressed between cathode 3 and anode 11, a plasma 14 lights between the cathode 3 and substrate 1. With this preferred embodiment, rather than the substrate 1 plasma facing surface being held at cathode potential to reflect electrons, this surface can be left floating. The electron containment is achieved by using the magnetic mirror effect. The result is that electrons are contained in all degrees of freedom by either magnetic and electrostatic Lorentz forces or by the magnetic mirror formed over the substrate.

Figure 1B:
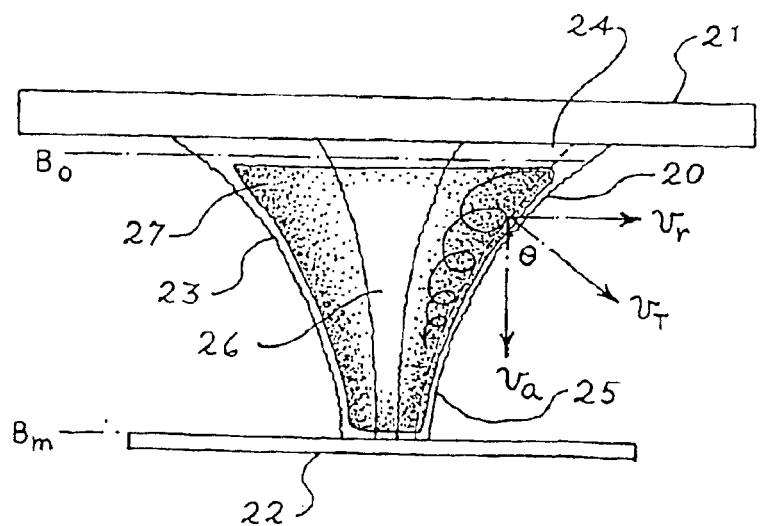
FIG. 1B shows a simplified view of electron movement within the mirror field.

Please now refer to FIG. 1B. The magnetic mirror effect is well understood and has been used to confine plasmas in particle fusion research. As an electron 24 moves along field line 25 from a region of weaker magnetic field Bo toward a stronger magnetic field Bm, the electron axial velocity Va is converted to radial gyration velocity Vr around the field line 25. If the axial velocity Va component reaches 0 before the electron has passed through the magnetic mirror at substrate 22, the electron is reflected back toward the weaker field region. As the ratio of strong to weak magnetic field increases, more electrons are reflected. This magnetic mirror effect is greatly assisted in the preferred embodiments by the electric field surrounding the magnetic field. This is depicted in FIG. 1A by arrows 17 and dashed line 15. This electric field imposes a radial force on electrons that increases the radial velocity and results in better electron containment by the mirror effect. This can be seen in the plasma as a cone of bright plasma surrounding the inner plasma region, region 27 in FIG. 1B.

This preferred embodiment uses these characteristics to confine a low pressure plasma for the processing of a substrate. In the FIG. 1A source, a rare earth magnet 5 is used to create a strong magnetic field region at the plasma facing surface of substrate 1. Further from the magnet, the field progressively weakens and spreads out to cathode plate 3. When a voltage of ~400V–800V is impressed between the cathode 3 and anode 11 and the chamber pressure is approximately between 3 and 100 mTorr, electrical breakdown occurs, and a plasma is maintained in region 14. As electrons are created either by secondary emission from the cathode 3 or by collisions in the plasma, they are confined within plasma region 14 and generate an endless Hall current within plasma 14. Several features, benefits, and limitations of this new source are discussed below.

When the substrate is floated or connected to the electrode opposed to electrode 3, at least a portion of the magnetic mirror created between the plasma facing surface of substrate 1 and the plasma facing surface of cathode 3 must exceed a ratio of 2:1. This ratio is defined as the field strength at a point on the plasma facing surface of substrate 1 versus the strength of the weakest point along that same field line in the gap. A weaker ratio than 2:1 results in too few electrons being reflected by the magnetic mirror, and a low pressure plasma cannot be sustained. The idea of this preferred embodiment is to confine sufficient electrons such that a low pressure plasma is sustained. In trials of many configurations, the ratio of at least 2:1 between the strong field over the substrate and the weaker field in the gap is important. As the ratio increases, the confinement improves. With rare earth magnets and substrates of thicknesses less than ½ inch, it is relatively easy to achieve ratios up to or exceeding 10:1. If the substrate is connected either in parallel to electrode 3 or to a separate power supply so that the substrate is biased to electrostatically confine electrons, the mirror field can be less than the 2:1 ratio.

The confinement obtained using this preferred embodiment is not as efficient as traditional electrostatic (Lorentz) confinement. While with magnetic mirror ratios exceeding 2:1 and the anode placement accentuating the radial electron velocities produces confinement sufficient for a low pressure plasma, a substantial electron flow out of the plasma into the substrate is apparent. This is deduced from several data points. The pressure required to sustain the plasma is higher than a typical magnetron source. Where a magnetron source operates at 1–5 mTorr, the magnetic mirror source operates at pressures above 3 mTorr with typical pressures of 10 mTorr. The voltage of the mirror source is higher. A modified Penning discharge as shown in U.S. patent application Ser. No. 10/036,067, which is hereby incorporated by reference, can sustain a plasma at less than 400V. The mirror source low voltage operation is closer to 500V. While the effect of reduced plasma confinement efficiency can be negative to some processes, it is a benefit to this preferred embodiment. Looking at the configuration of FIG. 1A, sufficient electron containment is achieved to create a dense, Hall current contained plasma while the "poor" confinement results in a high electron flow out of the plasma directed at the substrate 1. This is an ideal arrangement for many plasma processes. In the dense plasma formed directly over the substrate etching compounds, PECVD reactants, or plasma treatment gases are efficiently activated. Simultaneously, the high electron and ion flow sweeps the activated particles onto the substrate. An analogy is the plasma, constrained by the cathode electrode and the mirror magnetic field, is like a pressurized bottle. At the substrate, the compressed mirror field forms the nozzle on the bottle, both restraining the flow and directing the flow out of the bottle.

Another aspect of this preferred embodiment is that while the particle current to the substrate is high, the particle energy to the substrate is lower than sources energizing the plasma through the substrate. In this preferred embodiment, the substrate is electrically floating. The floating potential of ~−10V is low enough to largely rule out substrate or coating ablation or substrate damage due to impinging high energy particles. This is critically important to processes involving semiconductor wafers, low temperature substrate materials, and most PECVD processes.

Note that the substrate can also be biased negatively with the same power supply 16 (in the case of a conductive substrate) or a different power supply. As the substrate is negatively biased, more electrons are repelled from the substrate and contained within the plasma. This can be useful to produce increased ion energies impinging the substrate. For non-conductive substrates, an AC, RF or pulsed DC power supply can be used. The advantage of floating the substrate is that thick, large, non-conductive substrates such as architectural glass or flexible polymer web can be used without the cost or complexity of a backside AC power supply. In particular, when an insulating substrate is too thick to pass even an RF signal, the preferred embodiment can be applied.

The substrate can also be grounded or connected as the anode in the FIG. 1A circuit. The fundamental containment of the magnetic mirror continues to operate with the substrate as the anode. In this mode, the electron current to the substrate increases. While a sustained glow is maintained, the voltage is higher, a strong magnetic mirror is required, and/or the chamber pressure must be higher than when the substrate is floating or negatively biased. For some substrates, metal sheet for instance, a grounded substrate is much easier to configure. For others, plastic web or glass, the floating option is easier.

In any of these electrical configurations, the electron and ion flow onto the substrate is concentrated into the physical dimensions of the magnet pole as it emanates from the substrate. As the magnet pole is extended for wide substrates, the dense plasma region on the substrate takes the shape of a long bar. To obtain uniformity in the cross direction to the bar, the substrate must move in relation to the plasma. This is shown in later figures.

Only the field lines that pass from the substrate to cathode 3 are shown. There are other field lines that do not pass through cathode 3, but these are not important. Electrons caught in these lines simply are collected at the substrate or swept to the power supply and are not contained long enough to help sustain a plasma.

FIG. 1A shows a simple arrangement to explain the fundamental preferred embodiment. Later figures depict several sources implementing the preferred embodiment to process wafers, flat substrates, and flexible substrates. While an attempt has been made to show the breadth of applications that can be addressed with the preferred embodiment, many more will be apparent to one skilled in the art. The preferred embodiment presents an entirely new genus of magnetically confined plasma source that will have as many species as the traditional magnetron/Penning confinement method.

FIG. 1C shows a wafer processing plasma source of a preferred embodiment. Wafer 76 is placed upon non-magnetic platen 75. A magnetic field 78 is passed through the wafer and through the gap between the wafer and cover 72. Cover 72 is made of a high permeability material such as 400 series stainless steel. The magnetic circuit is formed by cover 72, steel shunt circle 81, shunt 74, and magnet 80. Shunt 74 and magnet 80 rotate under the stationary platen 75. As explained in FIG. 1A, by producing a strong magnetic mirror field over the wafer, a plasma is maintained directly above the wafer. This can be very beneficial because a dense plasma directly on the wafer is produced to etch, plasma treat, or PECVD coat the wafer while at the same time, because the wafer is not at high voltage, the energy of bombarding particles is lower and damage to wafer structures is reduced. Power supply 70 is connected between cover 72 and shunt 81. This can be a DC, AC or higher frequency supply. If an insulating coating is being deposited, the power supply should be of sufficient frequency to pass current through coating depositing on the plasma facing surface of electrodes 72 and 81. Magnet 80 is long enough to extend the plasma over the width of the wafer. When shunt 74 and magnet 80 are rotated, the plasma is swept over the wafer surface. Other means to sweep the plasma over a surface can be used. For instance, a robot arm can be used to move the magnet 80 under platen 75 in a prescribed pattern. In combination with an end point detector, the surface is "painted" with plasma until the detector indicates the process is complete. In this source, the magnet material is a rare earth type. The field produced between the wafer and electrode 72 is greater than 100 gauss—in other words, the plasma electrons are "magnetized" in the gap. Using today's materials, it is relatively easy to increase the magnetic field strength to also magnetize the plasma ions. This requires a magnetic field strength nearing or greater than 1000 G. The plasma of the method of the preferred embodiment adapts well to ion magnetization because there are no cathode surfaces to interrupt a larger gyro radius as with a planar magnetron type confinement. Where prior art sources have used magnets under the wafer to direct plasma down onto the wafer from another plasma source, the method of the preferred embodiment produces a dense plasma in and of itself, the dense plasma forming directly over the wafer surface. The benefits of focusing the electron and ion flow down on the wafer are fully realized in the method of the preferred embodiment. As shown by switch 83 and bias power supply 82, the inventive method allows for platen 75 and wafer 76 being either left floating, grounded or positively or negatively biased by supply 82.

FIG. 2 is an isometric view of the wafer processing plasma source of FIG. 1C. The source in this view is exploded to show the parts for clarity. Magnet 80 is disposed under platen 75 and wafer 76. The magnetic mirror field between electrode 72 and the wafer is augmented with shunts 74 and 81. By using a long magnet 80 that extends to or beyond the edge of wafer 76, the uniform Hall current plasma 77 is swept over the entire wafer as shunt 74 and magnet 80 are rotated.

FIG. 3A is a section view of a plasma source employing the method of the preferred embodiment. Substrate 1 may be a rigid planar substrate or a web tensioned to be planar between two continuously moving rolls. Substrate 1 is in proximity to shield 8 but is far enough away to allow the substrate 1 to be conveyed without scrapping shield 8. A magnetic field 12 is set up between the substrate and plate 3 by permanent magnets 5, 6, and 7, magnetic shunts 2 and 4 and cathode electrode 3. The field 12 is shaped into a shower head mirror field with the substrate 1 located at the compressed end. An electric field 15 is created by power supply 16 between cathode electrode plate 3 and the chamber ground. Shields 9, 10 and 11 are connected to ground. Magnet shunt 4 and shield 8 electrically float. Power supply 16 can be DC even in the case of a dielectric substrate because there is no current flow to shield 8. Alternatively, in the case where a dielectric coating is being applied, a pulsed DC or AC power supply 16 can be used. This is done because coating on electrode 3 and the grounded surfaces can impede DC current flow. The plasma 13 is confined by the magnetic field 12, electrode 3, and the magnetic mirror at the substrate 1. The electrons are trapped in the dimension out of or into the paper by electric field lines 15 that continuously circumvent the magnetic field 12 all around magnetic field 12. The result is that Hall current 14 created by the electron confinement is trapped into a continuous loop within the magnetic field 12. At low powers, this containment ring is readily apparent to the eye. At higher powers, the plasma expands to fill the region 13 between the substrate and electrode 3. Note that the anode is the chamber wall and grounded shields. This provides sufficient electric field penetration into the gap between cathode plate 3 and substrate 1 for the plasma confinement effects. The gap between cathode plate 3 and the substrate must be sufficient to strike a plasma. The gap size is also based upon the necessity to create a strong mirror magnetic field between surfaces 3 and 1, the need for a magnetic field sufficient to magnetize at least electrons and nice-eties such as being able to see the plasma from a view port. A typical gap is 2 inches. A source like that in FIG. 3A was built with a 4" long magnet 7 (out of the paper) and an 8" long cathode electrode 3. With the chamber pressure at 20 mTorr and a voltage of approximately 500V impressed between cathode electrode 3 and ground, a bright plasma is maintained on substrate 1 as shown. To start the discharge, the pressure may have to be spiked depending upon the ignition voltage of the power supply. While specific values are given here, different pressures, voltages, frequencies and power levels can be used depending upon the process (PECVD, treatment, etching), process gasses, substrate size and material, magnetic fields and other variables. The values given are intended to provide the engineer with starting values to demonstrate the preferred embodiment. As with traditional magnetron confinement, the operating values can vary widely while still receiving the benefits of the preferred embodiment.

FIG. 3B is an isometric view of an extended FIG. 3A plasma source. In this view, one can see that the plasma Hall current is contained within the dipole magnetic field created by magnets 5, 6, and 7 and shunts 2 and 4 and electrode 3. Note that with this dipole arrangement, magnet pole 7 simply ends near the edge of the substrate. The magnetic field 12 in the gap extends from permanent magnet 7 to cathode plate 3 to create one extended showerhead mirror magnetic field. Within this field, Hall currents are confined into a racetrack 14, and an intense plasma is created in this looping ring. Substrate 1 is conveyed over magnet poles 6 and 7 and shield 8. The gap between shields 8 and 9 is small to minimize spurious plasma generation while allowing the substrate to pass through unobstructed. Shield 10 and 11 may receive enough heat to require water cooling. This is largely dependent upon the type of process, power levels, materials and factors relating to the configuration of the plasma contacting surfaces, fields, etc. For most industrial processes with long process runs and high powers, all electrodes must be water cooled using known techniques.

FIG. 4 shows a section view of another planar source implementing this preferred embodiment. This source is composed of two identical sources 10 and 11, connected across a mid-frequency (50–450 kHz) power supply 16. This arrangement is similar to two planar magnetrons connected across an AC supply. As with the planar magnetron configuration, this is useful when insulating coatings are produced because each source alternates as both an anode and cathode. In the cathode mode, ion impingement tends to ablate and clean the electrode so that electrode conductivity is maintained over extended production runs. Sources 10 is composed of a magnetron magnet array with center magnets 7, outer ring magnets 6 and magnet shunt 2. Non-magnetic cover 8 protects the magnets from UV light. Planar substrate 1 is supported by rollers not shown to pass over cover 8 without contact. Above substrate 1, electrode 3 is a box following the outline of magnets 6. Electrode 3 is constructed of high permeability material such as mild steel to conduct the magnetic field as shown. Gap magnetic field lines 12 are shown as they emanate from magnets 7, pass through substrate 1 and end at electrode 3. The preferred embodiment is maintained in this arrangement with electrons contained by the magnetic field 12, cathode electrode 3 and the compressive magnetic mirror over the substrate. In this case, rather than a dipole magnetic field, a field more similar to a magnetron is created with the Hall current contained within the "wings" of plasma 14 within box 3. Note that instead of the electric field permeating into the sides of a dipole magnetic field, the electric field penetrates into the top of the magnetic field as shown by schematic electric field lines 15. The result is the same, as electrons are confined into an endless Hall current region within magnetic field 12. Source 11 has the identical construction. When power supply 16 is turned on and process gas is supplied into the source chamber at −5–100 mTorr, plasmas 14 and 34 light. Power supply 16 may be set to a wide range of frequencies. Typically, thin films collecting on electrodes 3 and 23 are conductive at frequencies above 20 kHz. This source excels at plasma processes such as plasma treatment, PECVD and plasma etching. It is particularly useful when thick, large substrates such as architectural glass require one of these processes. Because the glass is electrically floating, the difficulty of passing current through thick glass is removed, and a dense plasma is directed onto the substrate. Additionally, by positioning the cathode plates vertically, sputtering of the cathodes is directed away from the substrate. This reduces contamination of the substrate with sputtered material and reduces the heat load on the substrate. Therefore, as a PECVD coating is deposited on a substrate, the cathode surface is sputtering cleaning itself with the sputtered material directed away from the substrate. Vertical positioning of the cathodes is a significant benefit to some applications. Note that in production, the cathode electrodes 3 and 23 must be water cooled (not shown), and other surfaces may also require cooling depending upon the process conditions.

Sources 10 and 11 can be extended to any width required in the same way a magnetron sputter cathode can be extended. In this case, the magnetron magnet arrangement is lengthened under the substrate and the permeable box over the substrate is equally extended. As with a magnetron cathode, the confined Hall current moving around the "racetrack" provides an inherent uniformity across the length of the source. By moving the substrate orthogonally under the plasma, highly uniform plasma treatment of the surface is obtained.

Figure 5:
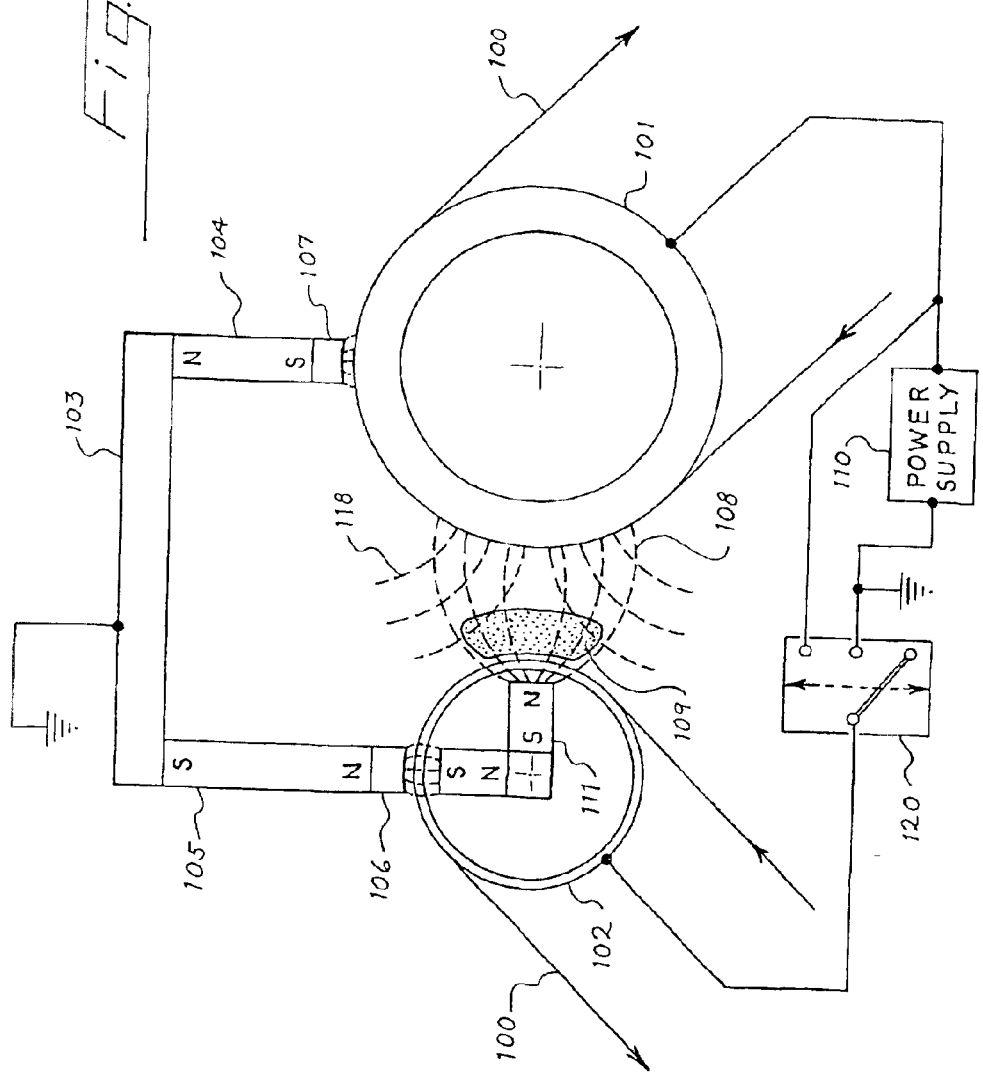
FIG. 5 shows a section view of an apparatus for plasma treating flexible web substrate.

FIG. 5 shows a section view of a web coating apparatus employing the preferred embodiment. In this embodiment, both rolls 101 and 102 support web 100, and web 100 is moved continuously over rolling supports 101 and 102. Roll 102 contains permanent magnet and magnet shunt assembly 111. Roll 101 is a steel roller of sufficient thickness to carry magnetic field 108. Magnetic field 108 is created in the gap between rolls 101 and 102 by magnetic assembly 111, steel roll 101, magnet shunt pieces 106 and 107, permanent magnets 104 and 105 and magnetic shunt 103. Due to the different pole structures, magnetic field 108 is not a symmetrical mirror field but takes on the appearance of a showerhead. Roll 101 is connected to power supply 110 as the cathode electrode and roll 102 can either be left electrically floating, connected as an anode in the electrical circuit, or connected in parallel with roll 101 as the cathode. Different outcomes result and offer different advantages depending upon process requirements. When roll 102 is left floating, an electron trap of the preferred embodiment is maintained by the magnetic mirror effect as electrons approach the compressed magnetic field 108 at the roll 102 surface and by the physical presence of web 100 on roll 102. The magnetic field 108 is surrounded by electric field 118 so that Hall currents are contained within magnetic field 108, and an intense plasma 109 is created. When roll 102 is left floating or connected as the anode, plasma 109 tends to push up against the web around roll 102. In this embodiment, magnetic pole pieces 106 and 107 are electrically floating, permanent magnets are ceramic type and are not electrically conductive, and magnetic shunt 103 is connected to the chamber ground. Per the inventive method, roll 101 must be connected as a cathode. Roll 102, with the stronger magnetic field, can be connected as the anode, cathode or floating.

FIG. 6 is another flexible web apparatus with a different type of magnetic field. In the earlier embodiment, the magnetic field lines in the gap between the rolls arced inward toward the center of the field. In this apparatus, the magnetic field 108 arcs away from the field centerline. Since either case produces magnetic field lines that pass through at least one cathode surface and at least one substrate surface, the advantage of the preferred embodiment is maintained. In this apparatus, roll 102 contains permanent magnets 114 and 116 and shunt 115 that produce magnet fields 108 between roll 102 and ferromagnetic plates 101, 112 and 113. Plates 101, 112 and 113 are curved to generally follow the curvature of roll 102. These plates can be flat or another shape. Plate 101 is connected to power supply 110 and serves as the cathode of the source. Plates 112 and 113 serve as the anode for the source. With this arrangement, electric fields 118 are set up between the cathode and anode surfaces. Note that because a dielectric web is not disposed over plate surfaces 101, 112 or 113, a DC power supply can be used. Alternately, if a dielectric PECVD coating is to be applied that will deposit an insulating coating over plates 101, 112 and 113, a pulsed DC or AC power supply can be used. The gap between cathode plate 101 and anode plates 112 and 113 is smaller than the dark space distance to avoid plasma in these gaps. Roll 102 supports web 100 and turns to continuously move new web in front of the plasma. Magnets 114 and 116 and shunt 115 do not turn with roll 102. In operation, a plasma 109 is formed within the extended cone of magnetic field lines that pass though cathode plate 101 and enter roll 102. Note that at the end of the source, there are no racetrack magnet turnarounds. Anode plates 112 and 113 close around cathode plate 101 to form the required continuous electric fields 118 around the magnetic field 108. FIG. 7 shows more detail on the end of the source. With the end containment of the Hall current in place, the continuous Hall current confinement region is formed within magnetic field 108, and uniform and intense plasma 109 results along the length of the roll 102.

FIG. 7 shows a top view of the source depicted in FIG. 6. In this view, the end containment of Hall currents can be seen. End containment is accomplished by providing continuous electric fields emanating from the roll 101 cathode surface (in upstream terms) to the anode through magnetic field 108. This produces the VxB forces on primary electrons that prevent them from reaching the anode plates 112 and 113. As the electrons move away from the cathode plate 101, they move closer to roll 102 until they are stopped by the diverging electric fields, compressing magnetic fields and the physical surface of the web 100 on roll 102. An advantage of this design is that while web 100 is in close proximity to plasma 109 as the web 100 passes over roll 102, the web 100 is not at cathode potential and does not receive the subsequent intense ion bombardment. By adjusting the magnetic field, electric fields, position of cathode, anode and substrate surfaces and other process dependent variables such as the process gases, many different processes and applications can be successfully accomplished.

Figure 8:
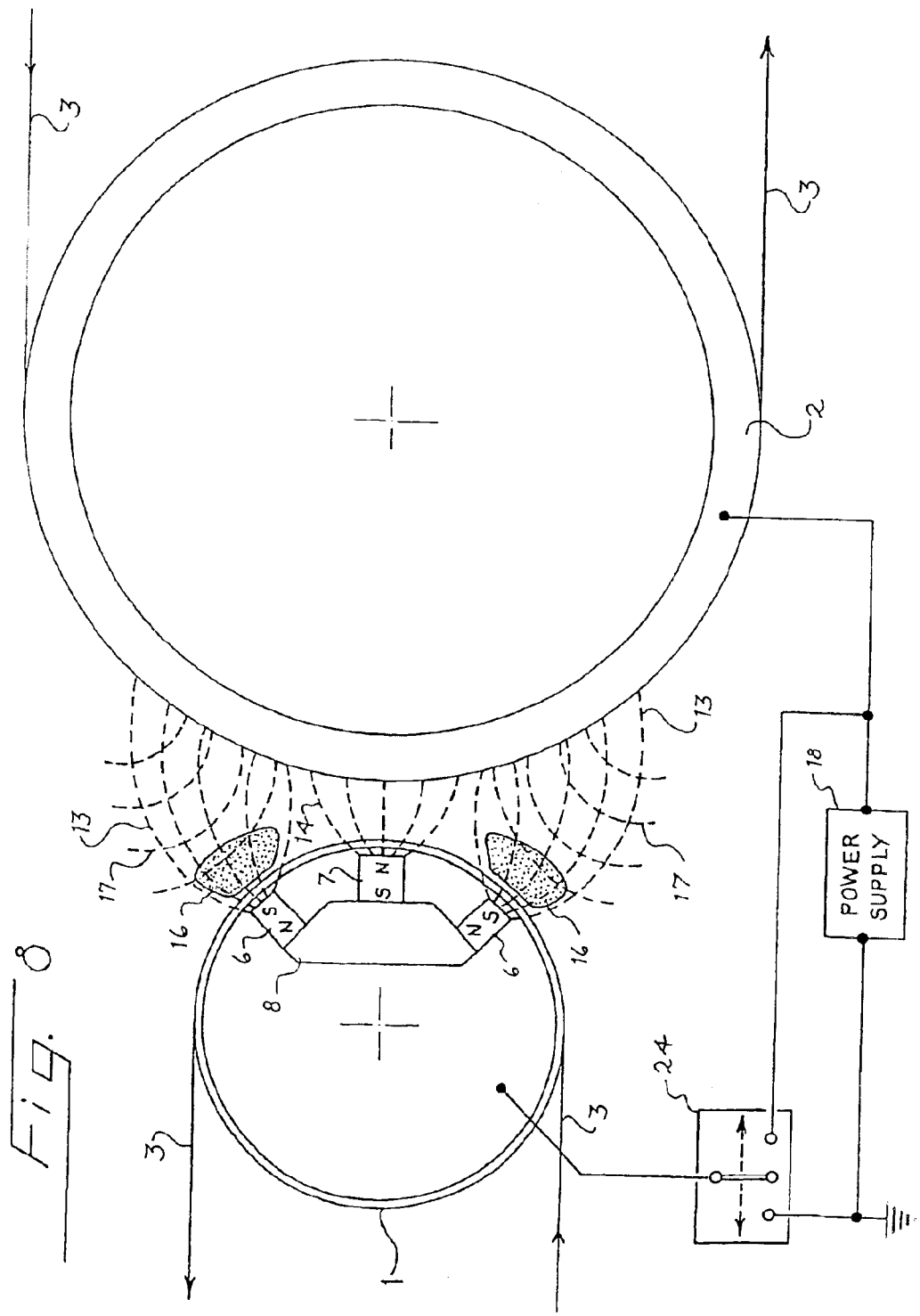
FIG. 8 shows a section view of a device for plasma treating flexible substrates.

FIG. 8 shows a section view of another web apparatus. In this embodiment, roll 1 contains a magnetron magnetic array composed of magnets 6 and 7 and shunt 8. This magnetron array does not rotate as roll 1 rotates and supports web 3. Roll 2 is hollow steel conveyor roll thick enough to largely carry the magnetic field emanating from roll 1. Magnetic field 13 is a racetrack field around center field 14 and is an un-symmetric magnetic mirror from permanent magnet 6 to steel roll 2. Roll 2 is the cathode electrode and is connected to power supply 18 while roll 1 is switch-selectable depending upon the application. With switch 24 connected to the cathode electrode, the roll pair behave similarly to the magnetron confined Penning discharge described in PCT application serial no. PCT/US02/11473. With the switch in the center and roll 1 floating, the electric field is between roll 2 and the chamber walls. Electrons are trapped in the magnetic mirror at roll 1 as they try and escape cathode roll 2. A plasma is formed against roll 1 contained within the racetrack magnetic field 13. While a plasma is present against roll 1 and therefore web 3, the web is not biased and receives relatively lower energy ion bombardment. PECVD films can be produced on web 3 with this arrangement due to the close proximity plasma 16. At the cathode electrode, the web 3 on roll 2 receives ion bombardment and some PECVD coating. The third switch setting connects roll 1 to the anode electrode of power supply 18. This produces additional electron current into web 3 on roll 1 that may be desirable in some cases. Roll 1 and/or roll 2 may be water cooled using known techniques.

FIG. 9 is a section view of a planar mirror magnetron device similar to FIG. 8. In this embodiment, a planar substrate 101 is disposed between surfaces 112 and 102, in close proximity to surface 112 while allowing the substrate 101 to be conveyed over surface 112 without hitting surface 112. Across the gap between surfaces 112 and 102, two magnetic fields are formed 108 and 110. Magnetic field 108 is shaped into a racetrack around the periphery of magnetic shunt plates 103 and 102. Magnetic field 110 is formed inside of magnetic field 108 also between the two shunt plates 102 and 103. Shunt plate 102 is connected to the cathode side of power supply 107. Surface 112 can be connected either to the cathode electrode, anode electrode or left floating. When the surface is left floating, a DC power supply may be used even if the substrate is a dielectric. If surface 112 is connected as the cathode or a dielectric PECVD coating is to be applied to substrate 101, the power supply 107 may be a pulsed DC or AC type supply. In the case where surface 112 is left floating, a plasma is generated by surface 102 in conjunction with racetrack shaped magnetic field 108. The plasma tends to form within racetrack magnetic field 108 and push up against the surface of substrate 108. With plasma in direct contact with the substrate 108, the substrate can be efficiently coated with a PECVD coating, etched or plasma treated.

FIG. 10 shows a side view of the source depicted in FIG. 9. This view shows that, similar to a magnetron sputtering cathode, the magnetically enhanced plasma of the method of the preferred embodiment can be uniformly extended for large area substrates. Just as this is a major advantage to magnetron sputtering, this is also a major advantage to the presently preferred embodiments. In this view, magnet shunt plate 102 and magnet assembly 103, 104 and 112 are separated by a gap. Magnetic field 108 is disposed across the gap and follows the racetrack shape of permanent magnets 104. A plasma 109 is formed against substrate 101 during operation.

FIG. 11 shows an isometric view of the source depicted in FIG. 9. In this view, the racetrack shape of permanent magnets 104 around permanent magnets 105 can be seen.

Figure 12:
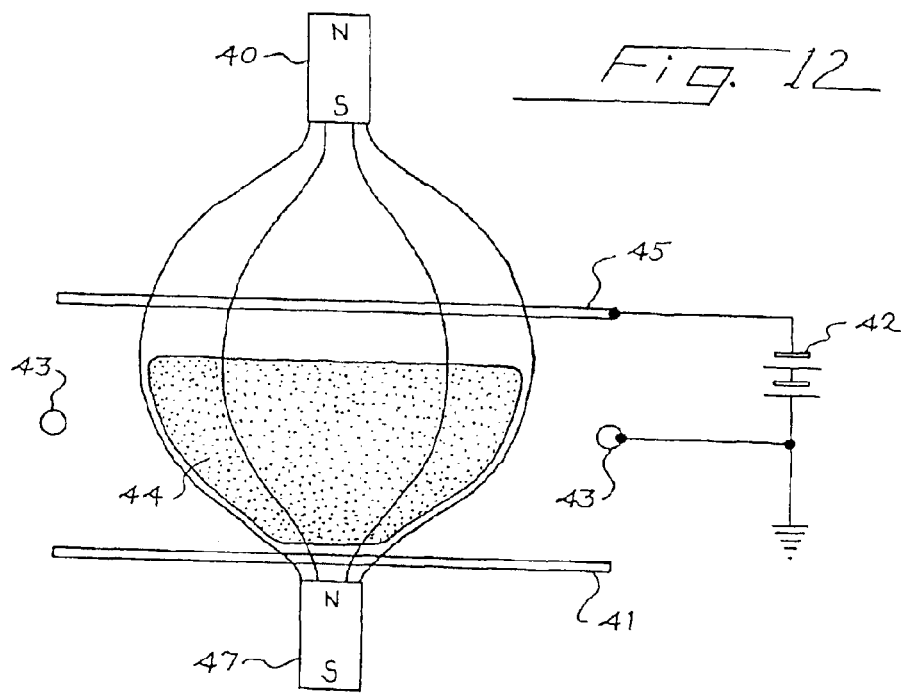
FIG. 12 shows a section view of another preferred embodiment.

FIG. 12 depicts a source of another preferred embodiment. In this source, two magnets are disposed across a gap. Cathode electrode 45 is located approximately in the center of the gap. Electrode 45 is constructed of a non-magnetic material such as copper, stainless steel or titanium. As can be seen, a mirror magnetic field is generated with the compressed field passing through the substrate 41 and the less compressed field passing through the cathode electrode 45. When voltage is impressed across the cathode electrode 45 and a ring anode 43 such that electric fields penetrate into the magnetic field sufficiently, the electron Hall current is contained within the magnetic field. With sufficient voltage and process gas pressure, a plasma 44 is formed between the cathode and substrate. The idea of this figure is to show that magnetic arrangements other than a high permeability cathode can be implemented. All the embodiments of the invention show a high permeability member or permanent magnet at the uncompressed, cathode electrode end of the magnetic field. This is because this works well to pull the magnetic field from the magnet under the substrate, through the gap and into the cathode electrode. While this remains true, an alternative is to position only a non-magnetic electrode over the substrate. For instance, in FIG. 12, magnet 40 could be removed. The magnetic field would primarily loop around from the north pole to south pole of magnet 47. A small portion of the field would indeed however pass from the north pole of magnet 47 and, before arriving at the south pole, pass through cathode surface 45. If this field is strong enough to magnetize electrons, a plasma per the inventive method will form. Again, because of the relative simplicity of using a magnetic material in the cathode 45 'assembly' and the benefit of increasing the field lines into the cathode, a magnetic material is preferred.

Note that cathode surface 45 can be moved closer to magnet 40. In this configuration, the electrons moving toward the substrate are moving from a region of weak magnetic field to a stronger field (with a ratio in excess of 1:2). While this does produce a confined plasma, it is not presented in the application figures because the source works much better when the cathode surface 45 is placed in the region of expanded, weaker magnetic field. The larger electron collection area may play a role in making the source operate with a brighter glow and at lower pressure and voltage.

Figure 13:
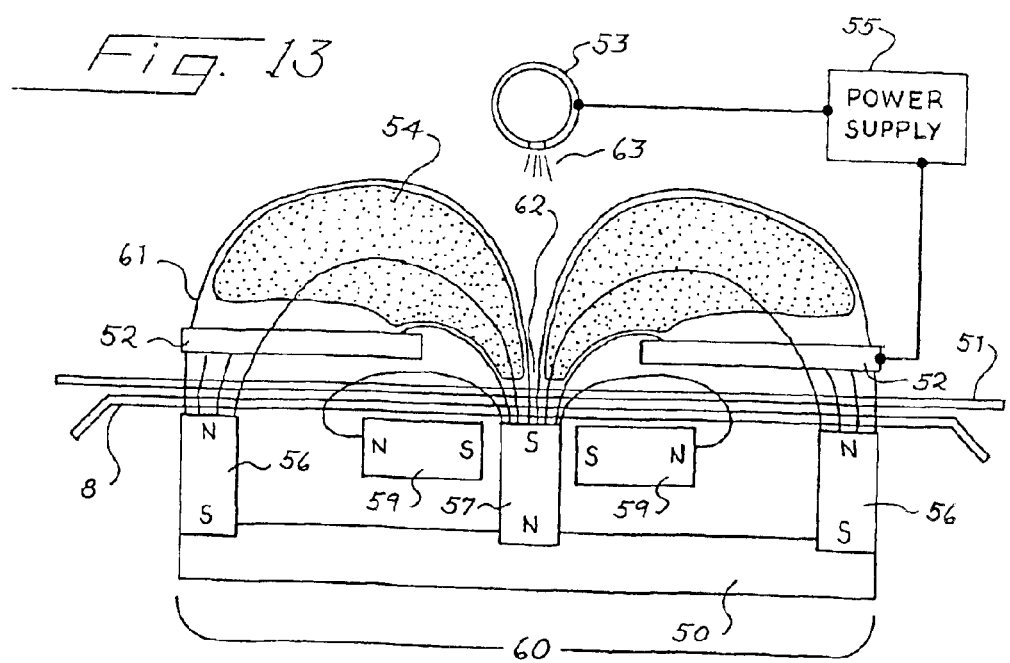
FIG. 13 shows a section view of another preferred embodiment.

FIG. 13 shows another variation of the preferred embodiment. In this source, the cathode plates 52 are parallel with substrate 51. Magnetron magnet array 60 is disposed under substrate 51 and is composed of magnets 56, 57 and 59 and magnetic shunt 50. Magnets 59 serve to push the field lines emanating from center magnets 57 up through substrate 51 so that they enter the top of cathode plate 52 as shown. Power supply 55 is connected between cathode electrode 52 and gas distribution anode electrode 53. The result is the same as the previous apparatus—a magnetically confined plasma 54 is generated within the region confined by magnetic fields 61, cathode electrode 52 and compressed magnetic mirror region 62. This figure shows that the magnetic field of the preferred embodiment may take on a variety of forms. Also shown is a method (magnets 59) to enhance the mirror effect passing through the substrate. This arrangement can be useful to reduce the amount of material sputtered from cathode 52 collecting on substrate 51.

FIG. 14 shows a preferred embodiment using a magnetron sputtering source. Magnet assembly 212 composed of magnets 206 and 207 and shunt 200 are positioned below planar substrate 201. Shunt bars 209 and 202 form a box over the substrate, and the magnetic field of the preferred embodiment is formed. Magnetron 208 is positioned above the mirror source. Plasma 210 is the sputtering racetrack plasma. The addition of a sputter magnetron over the mirror source can be useful to create PECVD films with metal atoms added to the coating structure. Also, the source of the preferred embodiment can be used to assist with reactive sputtering. In this depiction, an AC power supply is used and is connected between the mirror source and the planar magnetron. Alternately, each can have a separate power supply. As another alternative, two magnetrons can be connected to one AC supply, and the mating two mirror sources can have a separate AC supply as in FIG. 4.

Note that in this embodiment, two plasma sources are operated at the same time—a magnetron sputter cathode and a mirror source per the inventive method. In prior art, magnets under the substrate were used to focus the plasma to the substrate from a separate plasma source. In the present invention, the magnetic field and cathode surfaces create a stand alone plasma source that can be operated along with other plasma sources.

FIG. 15 shows an activated reactive evaporation source assisted by the preferred embodiments described above. In this implementation, a flexible web 301 is disposed round a rotating drum 302. Magnetron magnet array 300 is located inside the drum and does not rotate. External high permeability plates 304 are connected to power supply 310 as described above. Power supply 310 is connected to shield 307 (isolated from 304) and ground. A thermal evaporation source 303 emits condensate 308 toward web 301. Typical of an evaporation process, the required mean free path length for condensate to reach the substrate requires operation below 1 mTorr. This pressure is too low for stand alone mirror magnetron operation. So in this apparatus, the mirror magnetron plasma requires the presence of the evaporant to produce a local high pressure sufficient to ignite the plasma. The mirror magnetron creates a dense plasma on the web greatly assisting in reacting the condensate material. Reactant gas is introduced through distribution tubes 305. The gas flow is forced by shields 306 to largely flow between the web and electrodes 304. The gas is then separated from the condensate thermal source by the magnetic field 311 and subsequent plasma 312. The reactive deposition process is assisted also by the electron and ion flow into the substrate through the magnetic mirror nozzle effect as previously described. Note that an electron beam or laser source can be used in place of the thermal evaporation source.

FIG. 16 depicts another source useful for treating planar substrates. This source again shows the many forms the inventive method can take. In this source, the closed loop electron Hall current is extended beyond a simple racetrack shape. The mirror magnetic field 308 is created with magnets 306 and 307 and magnet shunt 305 under the substrate and plates 301 and 302 above the substrate. Plates 301 and 302 are connected as the cathode. In this case, the chamber wall is the opposed electrode. The plasma 304 forms Within the mirror magnetic field 308 per the inventive method and a dense plasma 304 traces the pole outline. Though different in appearance, the basic criteria of the inventive method is met: 1) A mirror magnetic field emanates up through the substrate, the field passes thru a plasma contain gap and then into an electron containing electrode surface. 2) Electric fields penetrate the magnetic field sufficient to contain the Hall current in an endless loop and 3) A substrate is moved relative to the plasma to uniformly treat the substrate. While more complicated, one possible advantage of this design is that more bands of mirror focused plasma 'nozzles' are brought into contact with substrate 300.

FIG. 17 is a section view of another planar substrate or flexible web plasma source. In this embodiment, a portion of the magnetic field 50 leaves magnet 40 and forms a mirror type field in the gap between the substrate 41 and pole piece 45. Shunt 46 directs the magnetic field over to pole 45 and down to magnet 47. In this way, two plasma 'cones' are created with one power supply 42. Note that poles 45 are shorter than magnets 40 and 47 so that the magnetic field blooms around the ends of poles 45 and allows the contained Hall currents to pass around the end of poles 45. In operation the plasmas 44 appear as two cones with poles 45 penetrating into the base of the cone. Stray magnetic field 49 does not 'light up' because the field lines do not pass through a cathode surface. Poles 45 are bolted to shunt 46 with screws 48. This subassembly is held in position over the substrate 41 and magnet assembly with a bracket and fasteners not shown. The substrate in this source is floating as is the magnets 40 and 47 and magnet shunt 43. The substrate is passed close to magnets 40 and 47 to maximize the mirror magnetic field on substrate 41. Note that because both the substrate 41 and magnets 40 and 47 are floating, no plasma lights behind the substrate during operation.

As has been described, the combined Lorentz and magnetic mirror electron confinement arrangement traps the Hall current in a racetrack orbit directly over the substrate. Of similar magnitude to Penning's work in the 1930's, this confinement regime opens doors to a wide range of processes and technologies producing results not resembling known prior art. Many applications for PECVD, plasma etching and plasma treatment will be substantially improved or made possible. Also as shown, the new source can be combined with other plasma sources to improve upon or create new plasma sources. While many benefits to this new technology will be found, some of the benefits are:

A dense plasma is created in a confined zone directly over a substrate, and a large electron/ion current is directed onto the substrate through the "nozzle" of the magnetic mirror. This results in high rate PECVD or other plasma activity on the substrate.

The magnetic and electric field confinement geometry produces a symmetrical, endless racetrack confinement zone similar to a planar magnetron sputtering device or a grid-less ion source. As is known in these technologies, the length of the confinement zone can be extended to accommodate wide substrates while maintaining a uniform plasma. This is a major improvement over unconfined RF or microwave discharges for large substrates at significantly less cost.

As a true magnetically enhanced plasma source, the efficient plasma confinement allows operation at low pressures and voltages. Many process advantages are gained by this. Plasma does not light in other parts of the chamber or on electrode surfaces outside of the containment zone. The plasma is characteristically stable and uniform. Lower plasma voltage requirements make the power supplies safer and less costly.

A significant advantage of low pressure PECVD operation is that the increased free mean path length allows powder free operation at high powers. Film morphology is also enhanced for many films at lower pressures.

The technology is adaptable to different process substrate energy requirements. As shown in the figures, the substrate can be floating, biased negatively, or biased positively to produce different results.

Finally, it should be noted that any of the alternatives discussed above can be used alone or in combination with one another. Some of these alternatives include:

The surface of the cathode electrode can be covered with a 'target' material that, if sputtered, is either helpful or benign to the process.

The surface of the cathode electrode can be positioned relative to the substrate so as to minimize the arrival of sputtered material from the electrode on the substrate.

The substrate can be biased positively, tied to ground, left floating, or biased negatively.

An AC or RF voltage can be used to bias the substrate.

DC, AC, or RF can be used to power the cathode electrode.

The magnetic field can be moved relative to the substrate instead of the substrate moving relative to the magnetic field.

The cathode and substrate surfaces can be non-parallel, as shown in FIG. 4 and FIG. 17.

The magnetic field can be made using a magnetron-type array.

Multiple dipole magnetic fields can be created and connected to one power supply.

The magnetic field can be made with high permeability materials and magnets both above and below the substrate or just below the substrate.

The substrate can be a flexible web supported by a conveyor roll.

The substrate can cover both surfaces. A compressed mirror surface is highly preferred. A less compressed surface is optional.

The magnetic field can be shaped concave or convex.

The mirror field can be shaped into a racetrack with the return field passing through the center of the racetrack.

The magnetic field can be produced with permanent magnets or electromagnets.

The mirror source can be combined with a sputter magnetron to assist with plasma reaction or substrate treatment.

The source can be used to assist a reactive process with a thermal evaporation or electron beam deposition process (or laser ablation).

It is intended that the foregoing detailed description be understood as an illustration of selected forms that the invention can take and not as a definition of the invention. It is only the following claims, including all equivalents, that are intended to define the scope of this invention.

What is claimed is:

1. A plasma source apparatus comprising:
   first and second surfaces with a gap between the surfaces, wherein the first surface comprises a substrate and wherein at least the second surface is connected to a power supply so as to contain electrons;
   a third surface connected to the power supply;
   a magnetic field passing into both the first and second surfaces and through the gap between the surfaces, wherein at least a portion of the magnetic field passing through the substrate is at least two times stronger at the substrate surface than at the second surface along that field line and is strong enough to magnetize electrons; and
   an electric field created by the power supply connected between the second surface and the third surface, wherein the electric field penetrates into an electron confining region of the magnetic field so that a created Hall electron current is contained within an endless loop.

2. The invention of claim 1, wherein the third surface comprises a ring anode.

3. The invention of claim 1, wherein the third surface is the substrate.

4. The invention of claim 1, wherein the first and second surfaces are contained in a chamber comprising grounded walls, and wherein the third surface is the grounded chamber walls.

5. The invention of claim 1, wherein one of the substrate and the magnetic field is moved relative to the other.

6. The invention of claim 1, wherein the at least a portion of the magnetic field passing through the substrate is at least four times stronger at the substrate surface than at the second surface along that field line.

7. The invention of claim 1, wherein the at least a portion of the magnetic field passing through the substrate is greater than 100 Gauss at a strongest point along the field line.

8. The invention of claim 1, wherein the second surface is covered by the substrate.

9. The invention of claim 1, wherein the substrate is biased positively.

10. The invention of claim 1, wherein the substrate is tied to ground.

11. The invention of claim 1, wherein the substrate is left floating.

12. The invention of claim 1, wherein the substrate is biased negatively.

13. The invention of claim 1, wherein an AC voltage is used to bias the substrate.

14. The invention of claim 1, wherein first and second surfaces are parallel.

15. The invention of claim 1, wherein first and second surfaces are non-parallel.

16. The invention of claim 1, wherein the substrate comprises a flexible web supported by a conveyor roll.

17. The invention of claim 1, wherein the mirror field is shaped into a racetrack with the return field passing through the center of the racetrack.

18. The invention of claim 1, wherein the plasma source apparatus is combined with a sputter magnetron to assist with one of plasma reaction and substrate treatment.

19. The invention of claim 1, wherein the plasma source apparatus is used to assist a reactive process with one of thermal evaporation, electron beam deposition process, and laser ablation.

20. A plasma source apparatus comprising:
   first and second surfaces with a gap between the surfaces, wherein the first surface comprises a substrate and wherein at least the second surface is connected to a power supply so as to contain electrons;
   a third surface connected to the power supply;
   a magnetic field passing through both the first and second surfaces and through the gap between the surfaces, wherein at least a portion of the magnetic field passing through the substrate is strong enough to magnetize electrons; and
   an electric field created by the power supply connected between the second surface and the third surface, wherein the electric field penetrates into an electron confining region of the magnetic field so that a created Hall electron current is contained within an endless loop;
   wherein the substrate surface is biased beyond self bias to add electrostatic electron confinement to mirror magnetic field confinement.

21. The invention of claim 20, wherein the at least a portion of the magnetic field passing through the substrate is at least two times stronger at the substrate surface than at a weakest point along that field line within the gap.

22. The invention of claim 20, wherein the at least a portion of the magnetic field passing through the substrate is greater than 100 Gauss at a strongest point along the field line.

23. The invention of claim 20, wherein one of the substrate and the magnetic field is moved relative to the other.

24. A plasma source apparatus comprising:
- at least two surfaces with a gap between the surfaces, wherein at least a portion of one of the surfaces is a substrate and wherein at least the non-substrate surface is connected as a cathode electrode;
- a mirror magnetic field extending between the surfaces through the gap, wherein at least a portion of the magnetic field entering the substrate surface contains field lines at least two times as strong as those field lines entering the cathode electrode;
- at least one anode structure disposed in relation to the mirror magnetic field to form a closed loop electron Hall current containment region within the mirror magnetic field, where upon with sufficient gas pressure and voltage between the electrodes and the anode structure, a plasma is formed in the containment region; and
- wherein the substrate is positioned to be treated by the plasma in a compressed end of the magnetic field, and wherein one of the substrate and the plasma is moved relative to the other.

25. The invention of claim 24, wherein the substrate comprises a flexible web supported by a conveyor roll.

26. The invention of claim 24, wherein the substrate is positioned to be treated by the plasma with a treatment selected from the group consisting of: a chemical vapor deposition process, a sputter coating process, an ion etch process, and combinations thereof.

27. The invention of claim 24, wherein the substrate containing surface is floating.

28. The invention of claim 24, wherein the substrate containing surface is the anode.

* * * * *